US012772681B2

(12) United States Patent
Woo et al.

(10) Patent No.: US 12,772,681 B2
(45) Date of Patent: Oct. 20, 2026

(54) DISPLAY APPARATUS WITH CONNECTION WIRING UNDERNEATH FOUR PIXEL ELECTRODES

(71) Applicant: Samsung Display Co., Ltd., Yongin-si (KR)

(72) Inventors: Minwoo Woo, Yongin-si (KR); Sewan Son, Yongin-si (KR); Seunghyun Lee, Yongin-si (KR); Wangwoo Lee, Yongin-si (KR); Jiseon Lee, Yongin-si (KR); Kyeongwoo Jang, Yongin-si (KR); Hyeri Cho, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 459 days.

(21) Appl. No.: 18/365,714

(22) Filed: Aug. 4, 2023

(65) Prior Publication Data

US 2024/0130180 A1 Apr. 18, 2024

(30) Foreign Application Priority Data

Oct. 13, 2022 (KR) ........................ 10-2022-0131653

(51) Int. Cl.
*H10K 59/131* (2023.01)

(52) U.S. Cl.
CPC .................................. *H10K 59/131* (2023.02)

(58) Field of Classification Search
CPC .................................................... H10K 59/131
See application file for complete search history.

(56) References Cited

U.S. PATENT DOCUMENTS 9,627,450 B2 4/2017 Jeung et al.
2017/0331073 A1* 11/2017 Choi ...................... H10K 77/10
2017/0373132 A1 12/2017 Choung
2021/0327958 A1 10/2021 Li et al.
2021/0384266 A1* 12/2021 Zhao .................... G09G 3/3225
2022/0069047 A1* 3/2022 Yang .................. H10K 59/1213
2022/0100240 A1 3/2022 Chang et al.
2022/0208088 A1 6/2022 Kim et al.
2022/0223673 A1* 7/2022 Xu ..................... H10K 59/1213
(Continued)

FOREIGN PATENT DOCUMENTS

CN 110554738 A 12/2019
CN 111710276 A 9/2020
(Continued)

*Primary Examiner* — Lex H Malsawma
(74) *Attorney, Agent, or Firm* — Womble Bond Dickinson (US) LLP

(57) ABSTRACT

A display apparatus includes: a first display element configured to emit light of a first color and comprising a first pixel electrode; a second display element configured to emit light of a second color that is different from the first color and comprising a second pixel electrode; a third display element configured to emit light of a third color that is different from the first color and the second color and comprising a third pixel electrode; a fourth display element configured to emit light of the first color and comprising a fourth pixel electrode; and a first connection wiring under the first to fourth pixel electrodes, configured to connect the first pixel electrode to the fourth pixel electrode, at least partially overlapping the first to fourth pixel electrodes, and comprising an oxide semiconductor material.

20 Claims, 11 Drawing Sheets

(56) References Cited

U.S. PATENT DOCUMENTS

| | | | |
|---|---|---|---|
| 2022/0285456 | A1 | 9/2022 | Hong et al. |
| 2022/0336564 | A1* | 10/2022 | An ........................ H10D 86/423 |

FOREIGN PATENT DOCUMENTS

| | | | |
|---|---|---|---|
| CN | 112987437 | A | 6/2021 |
| CN | 113178163 | A | 7/2021 |
| KR | 10-2022-0125902 | A | 9/2022 |
| KR | 10-2022-0143207 | A | 10/2022 |

* cited by examiner

DISPLAY APPARATUS WITH CONNECTION WIRING UNDERNEATH FOUR PIXEL ELECTRODES

CROSS-REFERENCE TO RELATED APPLICATION

The present application claims priority to and the benefit of Korean Patent Application No. 10-2022-0131653, filed on Oct. 13, 2022, in the Korean Intellectual Property Office, the disclosure of which is incorporated by reference herein in its entirety.

BACKGROUND

1. Field

Aspects of one or more embodiments relate to a display apparatus.

2. Description of the Related Art

Recently, display apparatuses have been used for various purposes. Also, as thicknesses and weights of display apparatuses have decreased, the range of applications of display apparatuses has increased.

As an area where images are displayed in a display apparatus increases, various functions linked to or associated with the display apparatus are added. In order to add various functions, there is ongoing research being conducted on a display apparatus having an area for displaying an image and performing various functions.

An area for displaying images and performing various functions may need to maintain a relatively high transmittance of light or sound in order to perform the functions. When a high transmittance is maintained in an area for displaying images and performing various functions, a resolution may decrease.

The above information disclosed in this Background section is only for enhancement of understanding of the background and therefore the information discussed in this Background section does not necessarily constitute prior art.

SUMMARY

Aspects of one or more embodiments include a display apparatus in which a relatively high transmittance and a relatively high resolution may be maintained.

However, technical characteristics of embodiments according to the present disclosure are not limited thereto, and other unmentioned technical characteristics will be apparent to one of ordinary skill in the art from the description of the disclosure.

Additional characteristics will be set forth in part in the description which follows and, in part, will be apparent from the description, or may be learned by practice of the presented embodiments.

According to one or more embodiments, a display apparatus includes a first display element including a first pixel electrode and configured to emit light of a first color, a second display element including a second pixel electrode and configured to emit light of a second color that is different from the first color, a third display element including a third pixel electrode and configured to emit light of a third color that is different from the first color and the second color, a fourth display element including a fourth pixel electrode and configured to emit light of the first color, and a first connection wiring located under the first to fourth pixel electrodes, configured to connect the first pixel electrode to the fourth pixel electrode, at least partially overlapping the first to fourth pixel electrodes, and including an oxide semiconductor material.

According to some embodiments, the display apparatus may further include a fifth display element including a fifth pixel electrode and configured to emit light of the second color, and a second connection wiring configured to connect the second pixel electrode to the fifth pixel electrode, wherein the first display element, the second display element, the fourth display element, and the fifth display element are sequentially arranged in a first direction.

According to some embodiments, the second connection wiring may at least partially overlap the second pixel electrode, the fourth pixel electrode, and the fifth pixel electrode.

According to some embodiments, the display apparatus may further include a sixth display element including a sixth pixel electrode and configured to emit light of the third color, and a third connection wiring configured to connect the third pixel electrode to the sixth pixel electrode, wherein the third display element, the second display element, and the sixth display element are sequentially arranged in a second direction that intersects the first direction.

According to some embodiments, the third connection wiring may at least partially overlap the second pixel electrode, the third pixel electrode, and the sixth pixel electrode.

According to some embodiments, the second connection wiring may at least partially overlap the second pixel electrode, the fourth pixel electrode, and the fifth pixel electrode, and the third connection wiring may at least partially overlap the second pixel electrode, the third pixel electrode, and the sixth pixel electrode, wherein a first portion edge of a first portion of the first connection wiring overlapping the second pixel electrode is located in a first edge of the second pixel electrode, a second portion edge of a second portion of the first connection wiring overlapping the third pixel electrode is located in a second edge of the third pixel electrode, a third portion edge of a third portion of the second connection wiring overlapping the fourth pixel electrode is located in a third edge of the fourth pixel electrode, and a fourth portion edge of a fourth portion of the third connection wiring overlapping the second pixel electrode is located in the first edge of the second pixel electrode.

According to some embodiments, the first connection wiring may include a first connection portion extending in the first direction and connected to the first pixel electrode, a second connection portion extending from the first connection portion in the second direction, a third connection portion extending in the first direction and connected to the fourth pixel electrode, and a fourth connection portion extending from the third connection portion in the second direction, and the third connection wiring may include a fifth connection portion extending in the second direction, connected to the third pixel electrode, and located between the second connection portion and the fourth connection portion of the first connection wiring.

According to some embodiments, the second connection wiring may include a sixth connection portion extending in the first direction, connected to the second pixel electrode, and located adjacent to the third connection wiring.

According to some embodiments, the display apparatus may further include a first contact portion configured to connect the first connection wiring to the fourth pixel electrode, a second contact portion configured to connect the second connection wiring to the second pixel electrode, and a third contact portion configured to connect the third connection wiring to the third pixel electrode, wherein the first connection wiring surrounds at least a part of the third contact portion, the second connection wiring surrounds at least a part of the first contact portion, and the third connection wiring surrounds at least a part of the second contact portion.

According to some embodiments, the first connection wiring may include a first portion overlapping the first pixel electrode, a second portion overlapping a part of the second pixel electrode, a third portion overlapping the third pixel electrode, a fourth portion overlapping another part of the second pixel electrode, and a fifth portion overlapping the fourth pixel electrode, wherein the first to fifth portions of the first connection wiring are sequentially arranged in the first connection wiring.

According to some embodiments, the display apparatus may further include a first insulating layer located under the first to fourth display elements and including a plurality of trenches surrounding at least parts of the first to fourth pixel electrodes in a plan view.

According to some embodiments, a planar shape of each of the plurality of trenches may be a substantially cross shape.

According to some embodiments, the display apparatus may further include a second insulating layer located between the first to fourth display elements and the first insulating layer, at least partially located in the plurality of trenches of the first insulating layer, and including a material different from a material of the first insulating layer.

According to some embodiments, the first insulating layer may include an inorganic material and the second insulating layer may include an organic material.

According to some embodiments, the display apparatus may further include a substrate including a first area and a second area that are adjacent to each other, a pixel circuit located in the second area and configured to drive the first display element and the fourth display element, and a circuit connection wiring configured to connect the pixel circuit to at least one of the first display element or the fourth display element, wherein the first to fourth display elements are located in the first area.

According to some embodiments, the pixel circuit may include a semiconductor layer and a gate electrode on the semiconductor layer, wherein the first connection wiring and the semiconductor layer are located on a same layer.

According to some embodiments, the circuit connection wiring may include a transparent conductive material.

According to some embodiments, the first connection wiring may include an oxide semiconductor material.

According to some embodiments, the first connection wiring may include a metal material.

According to some embodiments, the first color may be blue.

Other aspects, features, and characteristics of embodiments according to the present disclosure will become more apparent from the detailed description, the claims, and the drawings.

These general and specific embodiments may be implemented by using a system, a method, a computer program, or a combination thereof.

BRIEF DESCRIPTION OF THE DRAWINGS

The above and other aspects, features, and characteristics of certain embodiments will be more apparent from the following description taken in conjunction with the accompanying drawings, in which.

DETAILED DESCRIPTION

Figure 1:
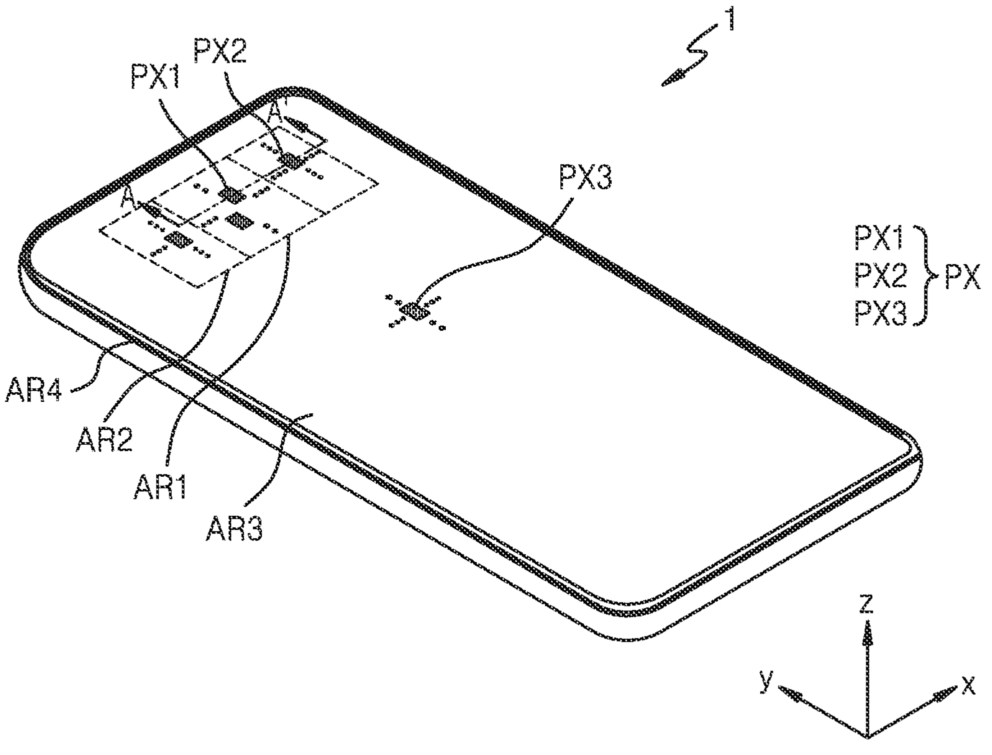
FIG. 1 is a perspective view schematically illustrating a display apparatus, according to some embodiments.

Reference will now be made in more detail to aspects of some embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the detailed description. Effects and features of the disclosure, and methods for achieving them will be clarified with reference to embodiments described below. In more detail with reference to the drawings. However, the disclosure is not limited to the following embodiments and may be embodied in various forms.

Hereinafter, aspects of some embodiments will be described in more detail with reference to the accompanying drawings, wherein the same or corresponding elements are denoted by the same reference numerals throughout and a repeated description thereof is omitted.

While such terms as "first," "second," etc., may be used to describe various components, such components are not be limited to the above terms. The above terms are used only to distinguish one component from another.

In the following embodiments, an expression used in the singular encompasses the expression of the plural, unless it has a clearly different meaning in the context.

It will be understood that the terms “including,” “having,” and “comprising” are intended to indicate the existence of the features or elements described in the specification, and are not intended to preclude the possibility that one or more other features or elements may exist or may be added.

It will be understood that when a layer, an area, or an element is referred to as being “on” another layer, area, or element, it may be directly on the other layer, area, or element, or intervening layers, areas, or elements may be present therebetween.

Sizes of components in the drawings may be exaggerated or contracted for convenience of explanation. For example, because sizes and thicknesses of elements in the drawings are arbitrarily illustrated for convenience of explanation, the disclosure is not limited thereto.

When a certain embodiment may be implemented differently, a specific process order may be different from the described order. For example, two consecutively described processes may be performed substantially at the same time or may be performed in an order opposite to the described order.

“A and/or B” is used herein to select only A, select only B, or select both A and B. “At least one of A and B” is used to select only A, select only B, or select both A and B.

It will be understood that when a layer, an area, or an element is referred to as being “connected” to another layer, area, or element, it may be “directly connected” to the other layer, area, or element and/or may be “indirectly connected” to the other layer, area, or element with other layers, areas, or elements interposed therebetween. For example, when a layer, an area, or an element is referred to as being “electrically connected,” it may be directly electrically connected, and/or may be indirectly electrically connected with intervening layers, areas, or elements therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view schematically illustrating a display apparatus, according to some embodiments.

Referring to FIG. 1, a display apparatus 1 may display images. The display apparatus 1 may include a pixel PX. The pixel PX may be defined as an area where a display element emits light. According to some embodiments, a plurality of pixels PX may be provided in the display apparatus 1. Each of the plurality of pixels PX may emit light, and collectively may display images in response to data signals. According to some embodiments, the pixels PX may include a first pixel PX1, a second pixel PX2, and a third pixel PX3, although embodiments according to the present disclosure are not limited thereto, and as a person having ordinary skill in the art would recognize, the display apparatus 1 may include any suitable number of pixels PX according to the design of the display apparatus 1. Hereinafter, each pixel PX refers to a sub-pixel that emits light of a different color, and may be one of, for example, a red sub-pixel, a green sub-pixel, and a blue sub-pixel.

The display apparatus 1 may include a first area AR1, a second area AR2, a third area AR3, and a fourth area AR4. The pixel PX may be located in the first area AR1, the second area AR2, and the third area AR3, and the first area AR1, the second area AR2, and the third area AR3 may be display areas. The pixel PX may not be located in the fourth area AR4, and the fourth area AR4 may be a non-display area. According to some embodiments, the fourth area AR4 may be located outside (e.g., in a periphery or outside a footprint) of the display area comprising the first area AR1, the second area AR2, and the third area AR3.

At least one of the first area AR1 or the second area AR2 may be an area that overlaps a component and where the pixel PX is located. For example, the first area AR1 may be an area that overlaps the component and where the pixel PX is located. Alternatively, the first area AR1 and the second area AR2 may be areas that overlap the component and where the pixel PX is located. According to some embodiments, the first pixel PX1 may be located in the first area AR1. The second pixel PX2 may be located in the second area AR2. Accordingly, the first area AR1 and the second area AR2 may be areas where an image is displayed and where a component is located.

At least one of the first area AR1 or the second area AR2 may overlap a component. Accordingly, the display apparatus 1 may have a relatively high transmittance of light or sound in the first area AR1 and the second area AR2. For example, a light transmittance of the display apparatus 1 in at least one of the first area AR1 or the second area AR2 may be equal to or greater than about 10%, and for example, equal to or greater than 25%, equal to or greater than 40%, equal to or greater than 50%, equal to or greater than 85%, or equal to or greater than 90%. According to some embodiments, a light transmittance of the display apparatus 1 in the first area AR1 may be higher than a light transmittance of the display apparatus 1 in the second area AR2.

According to some embodiments, the display apparatus 1 may include at least one first area AR1. For example, the display apparatus 1 may include one first area AR1, or may include a plurality of first areas AR1.

The second area AR2 may be located on a side of the first area AR1. For example, the first area AR1 and the second area AR2 may be arranged parallel to each other in an x direction or a −x direction. Alternatively, the first area AR1 and the second area AR2 may be arranged parallel to each other in a y direction or a −y direction. According to some embodiments, the second area AR2 may be located on both sides of the first area AR1.

Although the first area AR1 and the second area AR2 are located on an upper portion of the display apparatus 1 according to some embodiments. Embodiments according to the present disclosure are not limited thereto, however, and according to some embodiments, the first area AR1 and the second area AR2 may be located on a lower portion, a right portion, or a left portion of the display apparatus 1.

According to some embodiments, at least one of the first area AR1 or the second area AR2 may have any of various shapes such as a circular shape, an elliptical shape, a polygonal shape (e.g., a quadrangular shape), a star shape, or a diamond shape in a plan view (e.g., on an xy plane). In FIG. 1, each of the first area AR1 and the second area AR2 has a quadrangular shape.

The third area AR3 may at least partially surround the first area AR1 and the second area AR2. According to some embodiments, the third area AR3 may entirely surround the first area AR1 and the second area AR2. According to some embodiments, the third area AR3 may partially surround the first area AR1 and the second area AR2. The third pixel PX3 may be located in the third area AR3. According to some embodiments, the third area AR3 may be a display area. According to some embodiments, a resolution of the display apparatus 1 in the third area AR3 may be equal to or greater than a resolution of the display apparatus 1 in the first area AR1.

The fourth area AR4 may at least partially surround the third area AR3. According to some embodiments, the fourth area AR4 may entirely surround the third area AR3. The pixel PX may not be located in the fourth area AR4. According to some embodiments, the fourth area AR4 may be a non-display area.

Figure 2:
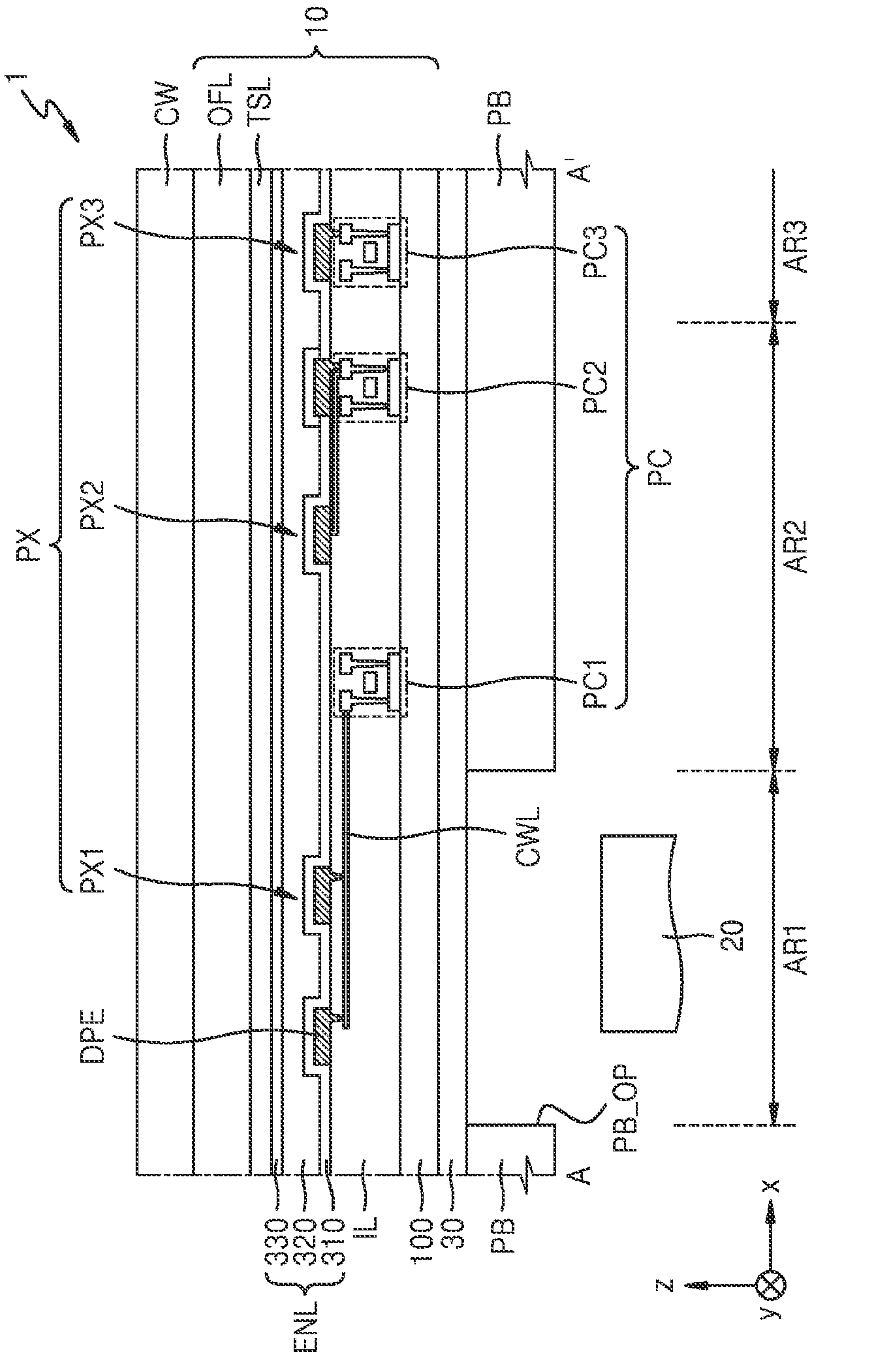
FIG. 2 is a cross-sectional view taken along the line A-A' of a portion of the display apparatus of FIG. 1 according to some embodiments.

FIG. 2 is a cross-sectional view taken along the line A-A' of a portion of the display apparatus of FIG. 1.

Referring to FIG. 2, the display apparatus 1 may include a display panel 10, a panel protection member PB, a panel protection film 30, a component 20, and a cover window CW. The display panel 10 may include a substrate 100, an insulating layer IL, a pixel circuit PC, a display element DPE, an encapsulation layer ENL, a touch sensor layer TSL, and an optical functional layer OFL.

The display apparatus 1 may include the first area AR1, the second area AR2, and the third area AR3. In other words, the first area AR1, the second area AR2, and the third area AR3 may be defined on the substrate 100 and multi-layer films on the substrate 100. For example, the first area AR1, the second area AR2, and the third area AR3 may be formed on the first substrate 100. That is, the substrate 100 may include the first area AR1, the second area AR2, and the third area AR3. The following will be described in more detail assuming that the substrate 100 includes the first area AR1, the second area AR2, and the third area AR3.

The substrate 100 may be formed of an insulating material such as glass, quartz, or a polymer resin. The substrate 100 may be a rigid substrate, or a flexible substrate that is bendable, foldable, or rollable.

The insulating layer IL and the pixel circuit PC may be located on the substrate 100. The insulating layer IL may insulate elements of the display panel 10. The insulating layer IL may include at least one of an organic material or an inorganic material. The pixel circuit PC may be electrically connected to the display element DPE to drive the display element DPE. The pixel circuit PC may be inserted into the insulating layer IL. According to some embodiments, the pixel circuit PC may include a first pixel circuit PC1, a second pixel circuit PC2, and a third pixel circuit PC3. The first pixel circuit PC1 and the second pixel circuit PC2 may be located in the second area AR2. The third pixel circuit PC3 may be located in the third area AR3. According to some embodiments, the pixel circuit PC may not be located in the first area AR1. Accordingly, a transmittance (e.g., a light transmittance) of the display panel 10 in the first area AR1 may be higher than a transmittance of the display panel 10 in the second area AR2 and the third area AR3.

The display element DPE may be located on the insulating layer IL. According to some embodiments, the display element DPE may be an organic light-emitting diode including an organic emission layer. Alternatively, the display element DPE may be a light-emitting diode (LED). The light-emitting diode may have a micro-scale or nano-scale size. For example, the light-emitting diode may be a micro light-emitting diode. Alternatively, the light-emitting diode may be a nanorod light-emitting diode. The nanorod light-emitting diode may include gallium nitride (GaN). According to some embodiments, a color conversion layer may be located on the nanorod light-emitting diode. The color conversion layer may include quantum dots. Alternatively, the display element DPE may be a quantum dot light-emitting diode including a quantum dot emission layer. Alternatively, the display element DPE may be an inorganic light-emitting diode including an inorganic semiconductor. The following will be described in more detail assuming that the display element DPE is an organic light-emitting diode.

The display panel 10 may include a plurality of display elements DPE. The plurality of display elements DPE may be located in the first area AR1, the second area AR2, and the third area AR3. According to some embodiments, the display element DPE may emit light to implement the pixel PX. For example, the display elements DPE located in the first area AR1 may emit light to implement the first pixels PX1. The display elements DPE located in the second area AR2 may emit light to implement the second pixels PX2. The display elements DPE located in the third area AR3 may emit light to implement the third pixels PX3. Accordingly, the display apparatus 1 may display an image in the first area AR1, the second area AR2, and the third area AR3.

According to some embodiments, a plurality of display elements DPE may be electrically connected to one first pixel circuit PC1. Accordingly, a plurality of display elements DPE may emit light by using a small number of first pixel circuits PC1, and the number of first pixel circuits PC1 may be reduced.

The first pixel circuit PC1 and the display element DPE located in the first area AR1 may be electrically connected to each other through a connection wiring CWL. The connection wiring CWL may extend from the second area AR2 to the first area AR1. Accordingly, the connection wiring CWL may overlap the first area AR1 and the second area AR2.

The connection wiring CWL may include a transparent conductive material. For example, the connection wiring CWL may include a transparent conductive oxide (TCO). The connection wiring CWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

A plurality of display elements DPE may be electrically connected to one second pixel circuit PC2. Accordingly, a plurality of display elements DPE may emit light by using a small number of second pixel circuits PC2, and the number of second pixel circuits PC2 may be reduced.

The encapsulation layer ENL may cover the display element DPE. According to some embodiments, the encapsulation layer ENL may include at least one inorganic encapsulation layer and at least one organic encapsulation layer. The at least one inorganic encapsulation layer may include at least one inorganic material from among aluminum oxide ($Al_2O_3$), titanium oxide ($TiO_2$), tantalum oxide ($Ta_2O_5$), zinc oxide (ZnO), silicon oxide ($SiO_2$), silicon nitride ($SiN_x$), and silicon oxynitride (SiON). The at least one organic encapsulation layer may include a polymer-based material. Examples of the polymer-based material may include an acrylic resin, an epoxy resin, polyimide, and polyethylene. According to some embodiments, the at least one organic encapsulation layer may include acrylate.

According to some embodiments, the encapsulation layer ENL may include a first inorganic encapsulation layer 310, the organic encapsulation layer 320, and a second inorganic encapsulation layer 330 which are sequentially stacked. The first inorganic encapsulation layer 310 and the second inorganic encapsulation layer 330 may prevent or reduce exposure of the organic encapsulation layer 320 and/or the display element DPE to a foreign material such as moisture.

According to some embodiments, the encapsulation layer ENL may have a structure in which the substrate 100 and an upper substrate that is a transparent member are coupled to each other by a sealing member to seal an inner space between the substrate 100 and the upper substrate. In this case, a moisture absorbent or a filler may be located in the inner space. The sealing member may be a sealant. According to some embodiments, the sealing member may include a material that is cured by a laser. For example, the sealing member may be a frit. For example, the sealing member may include a urethane resin, an epoxy resin, or an acrylic resin which is an organic sealant, or silicone that is an inorganic sealant. Examples of the urethane resin may include urethane acrylate. Examples of the acrylic resin may include butyl acrylate and ethylhexyl acrylate. The sealing member may include a material that is cured by heat.

The touch sensor layer TSL may obtain coordinate information according to an external input, for example, a touch event. The touch sensor layer TSL may include a touch electrode and touch wirings connected to the touch electrode. The touch sensor layer TSL may detect an external input by using a self-capacitive method or a mutual capacitive method.

The touch sensor layer TSL may be located on the encapsulation layer ENL. According to some embodiments, the touch sensor layer TSL may be located directly on the encapsulation layer ENL. In this case, an adhesive layer such as an optically clear adhesive may not be located between the touch sensor layer TSL and the encapsulation layer ENL. According to some embodiments, the touch sensor layer TSL may be separately formed on a touch substrate, and then may be coupled to the encapsulation layer ENL through an adhesive layer such as an optically clear adhesive.

The optical functional layer OFL may include an anti-reflection layer. The anti-reflection layer may reduce a reflectance of light (external light) incident on the display apparatus 1. In some embodiments, the optical functional layer OFL may be a polarizing film. In some embodiments, the optical functional layer OFL may be provided as a filter plate including a black matrix and color filters.

The cover window CW may be located on the display panel 10. The cover window CW may protect the display panel 10. The cover window CW may include at least one of glass, sapphire, or plastic. The cover window CW may include, for example, ultra-thin glass (UTG™) or colorless polyimide (CPI).

The panel protection member PB may be located under the substrate 100. The panel protection member PB may support and protect the substrate 100. According to some embodiments, the panel protection member PB may include an opening PB_OP overlapping the first area AR1. According to some embodiments, the opening PB_OP of the panel protection member PB may overlap the first area AR1 and the second area AR2. According to some embodiments, the panel protection member PB may include polyethylene terephthalate or polyimide.

The panel protection film 30 may be located between the substrate 100 and the panel protection member PB. The panel protection film 30 may cover an entire surface of the substrate 100. The panel protection film 30 may protect the substrate 100. According to some embodiments, the panel protection film 30 may include polyethylene terephthalate or polyimide. According to some embodiments, the panel protection film 30 may be an isotropic film. For example, the panel protection film 30 may include at least one of a cyclic olefin polymer (COP) film, a non-stretched polycarbonate (PC) film, or a triacetylcellulose (TAC) film.

The component 20 may be located under the display panel 10. According to some embodiments, the component 20 may be located opposite to the cover window CW with the display panel 10 therebetween. According to some embodiments, the component 20 may overlap the first area AR1. According to some embodiments, the component 20 may overlap the first area AR1 and the second area AR2.

The component 20 that is a camera using infrared light or visible light may include an image pickup device. Alternatively, the component 20 may be a solar cell, a flash, an illuminance sensor, a proximity sensor, or an iris sensor. Alternatively, the component 20 may have a function of receiving sound. In order to minimize or reduce limitations to a function of the component 20, the first pixel circuit PC1 for driving the display element DPE located in the first area AR1 may not be located in the first area AR1 but may be located in the second area AR2. Accordingly, a transmittance of the display panel 10 in the first area AR1 may be higher than a transmittance of the display panel 10 in the second area AR2.

Figure 3:
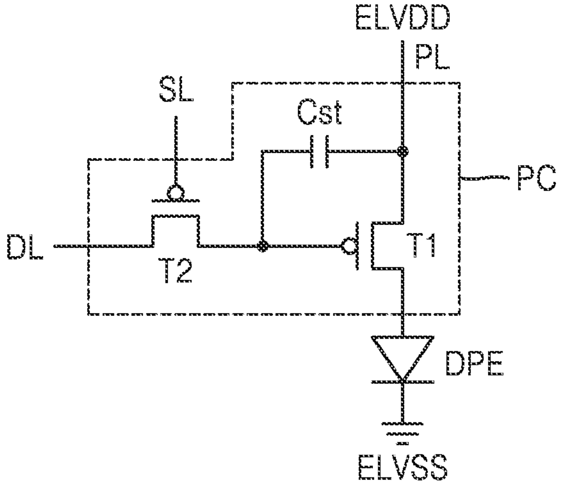
FIG. 3 is an equivalent circuit diagram illustrating a pixel circuit electrically connected to a display element, according to some embodiments.

FIG. 3 is an equivalent circuit diagram illustrating a pixel circuit electrically connected to a display element, according to some embodiments.

Referring to FIG. 3, the pixel circuit PC may include a driving transistor T1, a scan transistor T2, and a storage capacitor Cst. According to some embodiments, the driving transistor T1 and the scan transistor T2 may be thin-film transistors.

The scan transistor T2 may be connected to a scan line SL and a data line DL, and may transmit a data voltage input from the data line DL to the driving transistor T1 based on a scan signal input from the scan line SL. The storage capacitor Cst may be electrically connected to the scan transistor T2 and a driving voltage line PL, and may store a voltage corresponding to a difference between a voltage received from the scan transistor T2 and a driving voltage ELVDD supplied to the driving voltage line PL.

The driving transistor T1 may be electrically connected to the driving voltage line PL and the storage capacitor Cst, and may control driving current flowing from the driving voltage line PL to the display element DPE in response to a value of a voltage stored in the storage capacitor Cst. The display element DPE may emit light having a certain luminance due to the driving current. A counter electrode of the display element DPE may receive a common voltage ELVSS.

Although the pixel circuit PC includes two transistors and one storage capacitor in FIG. 3, the pixel circuit PC may include three or more transistors.

Figure 4:
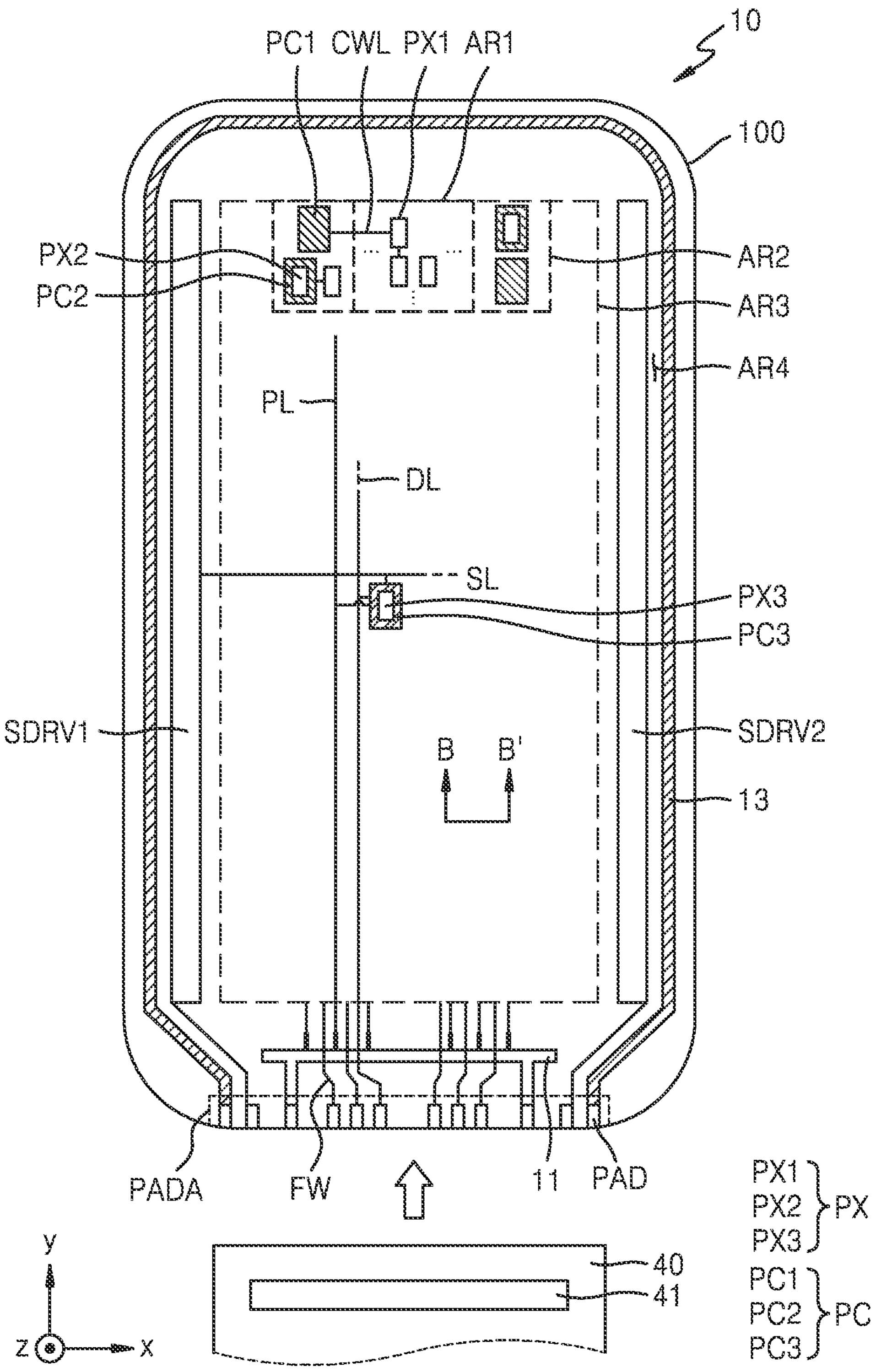
FIG. 4 is a plan view schematically illustrating a display panel, according to some embodiments.

FIG. 4 is a plan view schematically illustrating a display panel, according to some embodiments.

Referring to FIG. 4, the display panel 10 may include the substrate 100, the pixel circuit PC, and the pixel PX. According to some embodiments, the substrate 100 may include the first area AR1, the second area AR2, the third area AR3, and the fourth area AR4. The second area AR2 may be located on a side of the first area AR1. The third area AR3 may at least partially surround the first area AR1 and the second area AR2. The fourth area AR4 may at least partially surround the third area AR3.

The pixel circuit PC may include the first pixel circuit PC1, the second pixel circuit PC2, and the third pixel circuit PC3. According to some embodiments, the first pixel circuit PC1 and the second pixel circuit PC2 may be located in the second area AR2. The third pixel circuit PC3 may be located in the third area AR3. According to some embodiments, the pixel circuit PC may not be located in the first area AR1.

The pixel PX may be implemented using a display element such as an organic light-emitting diode. The pixel PX may include the first pixel PX1, the second pixel PX2, and the third pixel PX3. The first pixel PX1 may be located in the first area AR1. The first pixel PX1 may be electrically connected to the first pixel circuit PC1. According to some embodiments, the first pixel PX1 may be electrically connected to the first pixel circuit PC1 through the connection wiring CWL. According to some embodiments, one of the plurality of first pixels PX1 may be electrically connected to another one of the plurality of first pixels PX1. In this case, the one of the plurality of first pixels PX1 and the other one of the plurality of first pixels PX1 may be connected to one first pixel circuit PC1 to emit the same light.

The second pixel PX2 may be located in the second area AR2. The second pixel PX2 may be electrically connected to the second pixel circuit PC2. The second pixel PX2 may overlap the second pixel circuit PC2. According to some embodiments, one of the plurality of second pixels PX2 may be electrically connected to another one of the plurality of second pixels PX2. In this case, the one of the plurality of second pixels PX2 and the other one of the plurality of second pixels PX2 may be connected to one second pixel circuit PC2 to emit the same light.

The third pixel PX3 may be located in the third area AR3. The third pixel PX3 may be electrically connected to the third pixel circuit PC3. The third pixel PX3 may overlap the third pixel circuit PC3.

A plurality of pixels PX may be provided, and the plurality of pixels PX may emit light to display images. According to some embodiments, a plurality of first pixels PX1, a plurality of second pixels PX2, and a plurality of third pixels PX3 may be provided. The plurality of first pixels PX1, the plurality of second pixels PX2, and the plurality of third pixels PX3 may display one image, or may respectively display independent images.

According to some embodiments, a resolution of the display panel 10 in the first area AR1 and/or the second area AR2 may be equal to or less than a resolution of the display panel in the third area AR3. For example, a resolution of the display panel in the first area AR1 and/or the second area AR2 may be about ½, ⅜, ⅓, ¼, 2/9, ⅛, 1/9, or 1/16 of a resolution of the display panel 10 in the third area AR3.

The fourth area AR4 may be a non-display area in which the pixels PX are not located. In the fourth area AR4, a first scan driving circuit SDRV1, a second scan driving circuit SDRV2, a pad PAD, a driving voltage supply line 11, and a common voltage supply line 13 may be located.

Any one of the first scan driving circuit SDRV1 and the second scan driving circuit SDRV2 may apply a scan signal to the pixel circuit PC through the scan line SL. According to some embodiments, the first scan driving circuit SDRV1 and the second scan driving circuit SDRV2 may be located opposite to each other with the third area AR3 therebetween. According to some embodiments, one of the plurality of pixels PX may receive a scan signal from the first scan driving circuit SDRV1, and another one of the plurality of pixels PX may receive a scan signal from the second scan driving circuit SDRV2.

The pad PAD may be located in a pad area PADA that is a side portion of the fourth area AR4. The pad PAD may be exposed without being covered by an insulating layer, and may be connected to a display circuit board 40. A display driver 41 may be located on the display circuit board 40.

The display driver 41 may generate a signal transmitted to the first scan driving circuit SDRV1 and the second scan driving circuit SDRV2. The display driver 41 may generate a data signal (or a data voltage), and the generated data signal may be transmitted to the pixel circuit PC through a fan-out wiring FW and the data line DL connected to the fan-out wiring FW.

The display driver 41 may supply the driving voltage ELVDD (see FIG. 3) to the driving voltage supply line 11, and may supply the common voltage ELVSS (see FIG. 3) to the common voltage supply line 13. The driving voltage ELVDD may be supplied to the pixel circuit PC through the driving voltage line PL connected to the driving voltage supply line 11, and the common voltage ELVSS may be supplied to a counter electrode of a display element connected to the common voltage supply line 13.

Figure 5:
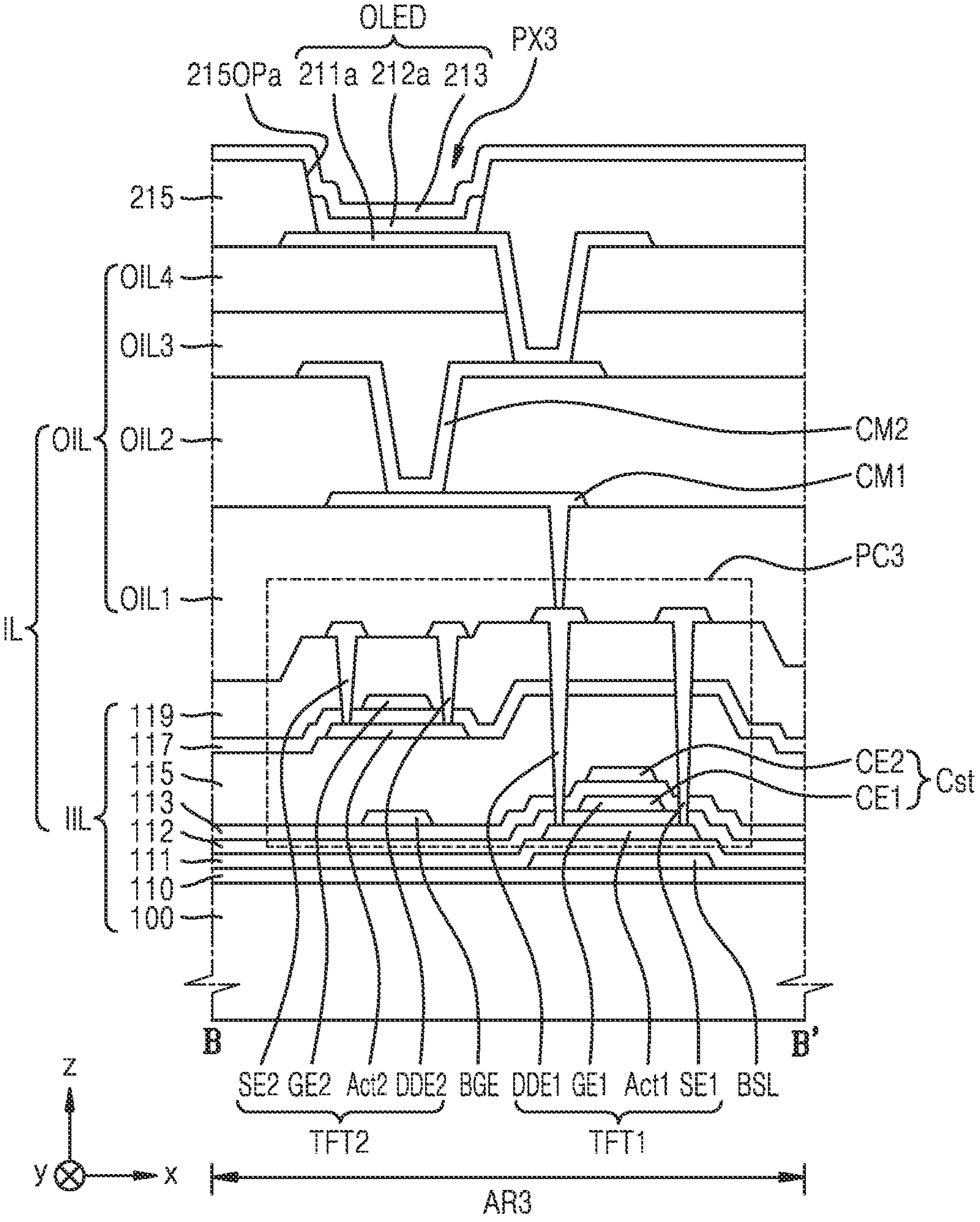
FIG. 5 is a cross-sectional view taken along the line B-B' of a portion of the display panel of FIG. 4 according to some embodiments.

FIG. 5 is a cross-sectional view taken along the line B-B' of a portion of the display panel of FIG. 4. In more detail, FIG. 5 is a cross-sectional view taken along the line B-B' of a portion of the third area AR3 of FIG. 4.

Referring to FIG. 5, the display panel 10 may include the substrate 100, the insulating layer IL, the third pixel circuit PC3, an organic light-emitting diode OLED as a display element, and the pixel defining layer 215.

The substrate 100 may include glass or a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. According to some embodiments, the substrate 100 may have a multi-layer structure including a base layer including the polymer resin and a barrier layer. The substrate 100 including the polymer resin may be flexible, rollable, or bendable.

The insulating layer IL may be located on the substrate 100. The insulating layer IL may include an inorganic insulating layer IIL and an organic insulating layer OIL. According to some embodiments, the inorganic insulating layer IIL may include a barrier layer 110, a buffer layer 111, a first gate insulating layer 112, a second gate insulating layer 113, a first inorganic insulating layer 115, a second inorganic insulating layer 117, and an interlayer insulating layer 119.

The third pixel circuit PC3 may be located in the third area AR3. The third pixel circuit PC3 may include a first transistor TFT1, a second transistor TFT2, and a storage capacitor Cst. The first transistor TFT1 may include a first semiconductor Act1, a first gate electrode GE1, a first source electrode SE1, and a first drain electrode DDE1. The second transistor TFT2 may include a second semiconductor layer Act2, a second gate electrode GE2, a second source electrode SE2, and a second drain electrode DDE2. The storage capacitor Cst may include a lower electrode CE1 and an upper electrode CE2.

The barrier layer 110 may be located on the substrate 100. The barrier layer 110 may prevent, reduce, or minimize penetration of impurities from the substrate 100 or the like into the first semiconductor layer Act1 and the second semiconductor layer Act2. The barrier layer 110 may include an inorganic material such as oxide or nitride, an organic material, or a combination of an organic material and an inorganic material, and may have a single or multi-layer structure including an inorganic material and an organic material.

The buffer layer 111 may be located on the barrier layer 110. The buffer layer 111 may include an inorganic insulating material such as silicon nitride ($SiN_X$), silicon oxynitride (SiON), or silicon oxide ($SiO_2$), and may have a single or multi-layer structure including the inorganic insulating material.

The first semiconductor layer Act1 may include a silicon semiconductor. The first semiconductor layer Act1 may include polysilicon. Alternatively, the first semiconductor layer Act1 may include amorphous silicon. In some embodiments, the first semiconductor layer Act1 may include an oxide semiconductor, or may include an organic semiconductor. The first semiconductor layer Act1 may include a channel region, and a drain region and a source region located on both sides of the channel region. The first gate electrode GE1 may overlap the channel region.

The first gate electrode GE1 may overlap the first semiconductor layer Act1. The first gate electrode GE1 may include a low-resistance metal material. The first gate electrode GE1 may include a conductive material including molybdenum (Mo), aluminum (Al), copper (Cu), or titanium (Ti), and may have a single or multi-layer structure including the above material.

The first gate insulating layer 112 may be located between the first semiconductor layer Act1 and the first gate electrode GE1. Accordingly, the first semiconductor layer Act1 may be insulated from the first gate electrode GE1. The first gate insulating layer 112 may include an inorganic insulating material such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. The second gate insulating layer 113 may be located on the first gate electrode GE1. The second gate insulating layer 113 may include an inorganic insulating material such as silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide (ZnO), like the first gate insulating layer 112.

The upper electrode CE2 may be located on the second gate insulating layer 113. The upper electrode CE2 may overlap the first gate electrode GE1 that is located below the upper electrode CE2. In this case, the upper electrode CE2 and the first gate electrode GE1 may overlap each other with the second gate insulating layer 113 therebetween to constitute the storage capacitor Cst. That is, the first gate electrode GE1 of the first transistor TFT1 may function as the lower electrode CE1 of the storage capacitor Cst.

As such, the storage capacitor Cst and the first transistor TFT1 may overlap each other. In some embodiments, the storage capacitor Cst may not overlap the first transistor TFT1.

The upper electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single or multi-layer structure including the above material.

The first inorganic insulating layer 115 may cover the upper electrode CE2. According to some embodiments, the first inorganic insulating layer 115 may cover the first gate electrode GE1. The first inorganic insulating layer 115 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The first inorganic insulating layer 115 may have a single or multi-layer structure including the above inorganic insulating material.

The second semiconductor layer Act2 may be located on the first inorganic insulating layer 115. According to some embodiments, the second semiconductor layer Act2 may include a channel region, and a source region and a drain region located on both sides of the channel region. The second semiconductor layer Act2 may include an oxide semiconductor. For example, the second semiconductor layer Act2 may be formed of a Zn oxide-based material such as Zn oxide, In—Zn oxide, or Ga—In—Zn oxide. Alternatively, the second semiconductor layer Act2 may be formed of an In—Ga—Zn—O (IGZO), In—Sn—Zn—O (ITZO), or In—Ga—Sn—Zn—O (IGTZO) semiconductor in which a metal such as indium (In), gallium (Ga), or tin (Sn) is contained in zinc oxide (ZnO).

The source region and the drain region of the second semiconductor layer Act2 may be formed by adjusting a carrier concentration of an oxide semiconductor to make the oxide semiconductor conductive. For example, the source region and the drain region of the second semiconductor layer Act2 may be formed by increasing a carrier concentration through plasma treatment using a hydrogen-based gas, a fluorine-based gas, or a combination thereof on an oxide semiconductor.

The second inorganic insulating layer 117 may cover the second semiconductor layer Act2. The second inorganic insulating layer 117 may be located between the second semiconductor layer Act2 and the second gate electrode GE2. According to some embodiments, the second inorganic insulating layer 117 may be entirely located on the substrate 100. According to some embodiments, the second inorganic insulating layer 117 may be patterned according to a shape of the second gate electrode GE2. The second inorganic insulating layer 117 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The second inorganic insulating layer 117 may have a single or multi-layer structure including the above inorganic insulating material.

The second gate electrode GE2 may be located on the second inorganic insulating layer 117. The second gate electrode GE2 may overlap the second semiconductor layer Act2. The second gate electrode GE2 may overlap the channel region of the second semiconductor layer Act2. According to some embodiments, the second gate electrode GE2 may include a conductive material including molybdenum (Mo), aluminum (Al), copper (Cu), or titanium (Ti), and may have a single or multi-layer structure including the above material.

An interlayer insulating layer 119 may cover the second gate electrode GE2. The interlayer insulating layer 119 may include silicon oxide ($SiO_2$), silicon nitride ($SiN_X$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnO). The interlayer insulating layer 119 may have a single or multi-layer structure including the above inorganic insulating material.

The first source electrode SE1 and the first drain electrode DDE1 may be located on the interlayer insulating layer 119. The first source electrode SE1 and the first drain electrode DDE1 may be connected to the first semiconductor layer Act1. The first source electrode SE1 and the first drain electrode DDE1 may be connected to the first semiconductor layer Act1 through contact holes of insulating layers.

The second source electrode SE2 and the second drain electrode DDE2 may be located on the interlayer insulating layer 119. The second source electrode SE2 and the second drain electrode DDE2 may be electrically connected to the second semiconductor layer Act2. The second source electrode SE2 and the second drain electrode DDE2 may be electrically connected to the second semiconductor layer Act2 through contact holes of insulating layers.

Each of the first source electrode SE1, the first drain electrode DDE1, the second source electrode SE2, and the second drain electrode DDE2 may include a material having excellent conductivity. Each of the first source electrode SE1, the first drain electrode DDE1, the second source electrode SE2, and the second drain electrode DDE2 may include a conductive material including molybdenum (Mo), aluminum (Al), copper (Cu), or titanium (Ti), and may have a single or multi-layer structure including the above material. According to some embodiments, each of the first source electrode SE1, the first drain electrode DDE1, the second source electrode SE2, and the second drain electrode DDE2 may have a multi-layer structure including Ti/Al/Ti.

Because the first transistor TFT1 including the first semiconductor layer Act1 including a silicon semiconductor has high reliability, the first transistor TFT1 may be used as a driving transistor to implement the display panel 10 having relatively high quality.

Because an oxide semiconductor has relatively high carrier mobility and relatively small leakage current, a voltage drop may not be large even when a driving time is long. That is, because a color change in an image due to a voltage drop is not large even during low frequency driving, low frequency driving may be possible. As such, because an oxide semiconductor has small leakage current, when an oxide semiconductor is applied to at least one of transistors other than a driving transistor, leakage current may be prevented and power consumption may be reduced. For example, the second transistor TFT2 may be used as a switching transistor.

A lower gate electrode BGE may be located under the second semiconductor layer Act2. According to some embodiments, the lower gate electrode BGE may be located between the second gate insulating layer 113 and the first inorganic insulating layer 115. According to some embodiments, the lower gate electrode BGE may receive a gate signal. In this case, the second transistor TFT2 may have a dual gate electrode structure in which gate electrodes are located over and under the second semiconductor layer Act2.

According to some embodiments, a lower shielding layer BSL may be located between the substrate 100 and the third pixel circuit PC3 overlapping the third area AR3. According to some embodiments, the lower shielding layer BSL may overlap the first transistor TFT1. A constant voltage may be applied to the lower shielding layer BSL. As the lower shielding layer BSL is located under the first transistor TFT1, the first transistor TFT1 may be hardly affected by ambient interference signals, thereby improving reliability.

The lower shielding layer BSL may include a transparent conductive material. For example, the lower shielding layer BSL may include a transparent conductive oxide (TCO). The lower shielding layer BSL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The organic insulating layer OIL may be located on the inorganic insulating layer IIL. According to some embodiments, the organic insulating layer OIL may be located on the substrate 100. The organic insulating layer OIL may include a first organic insulating layer OIL1, a second organic insulating layer OIL2, a third organic insulating layer OIL3, and a fourth organic insulating layer OIL4.

The first organic insulating layer OIL1 may be located to cover the first source electrode SE1, the first drain electrode DDE1, the second source electrode SE2, and the second drain electrode DDE2. The first organic insulating layer OIL1 may include an organic material. For example, the first planarization insulating layer OIL1 may include an organic insulating material such as a general-purpose polymer (e.g., polymethyl methacrylate (PMMA) or polystyrene (PS)), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A first connection electrode CM1 may be located on the first organic insulating layer OIL1. The first connection electrode CM1 may be connected to the first drain electrode DDE1 or the second source electrode SE1 through a contact hole of the first organic insulating layer OIL1. The first connection electrode CM1 may include a material having excellent conductivity. The first connection electrode CM1 may include a conductive material including molybdenum (Mo), aluminum (Al), copper (Cu), or titanium (Ti), and may have a single or multi-layer structure including the above material. According to some embodiments, the first connection electrode CM1 may have a multi-layer structure including Ti/Al/Ti.

The second organic insulating layer OIL2 may be located to cover the first connection electrode CM1. The second organic insulating layer OIL2 may include an organic material. For example, the second organic insulating layer OIL2 may include an organic insulating material such as a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

A second connection electrode CM2 may be located on the second organic insulating layer OIL2. The second connection electrode CM2 may be connected to the first connection electrode CM1 through a contact hole of the second organic insulating layer OIL2. The second connection electrode CM2 may include a transparent conductive material. For example, the second connection electrode CM2 may include a transparent conductive oxide (TCO). The second connection electrode CM2 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The third organic insulating layer OIL3 may be located to cover the second connection electrode CM2. The third organic insulating layer OIL3 may include an organic material. For example, the third organic insulating layer OIL3 may include an organic insulating material such as a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

The fourth organic insulating layer OIL4 may be located on the third organic insulating layer OIL3. The fourth organic insulating layer OIL4 may include an organic material. For example, the fourth organic insulating layer OIL4 may include an organic insulating material such as a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a blend thereof.

According to some embodiments, a conductive layer may be located between the third organic insulating layer OIL3 and the fourth organic insulating layer OIL4. The conductive layer may include a transparent conductive material. For example, the conductive layer may include a transparent conductive oxide (TCO). The conductive layer may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The organic light-emitting diode OLED as a display element may be located on the organic insulating layer OIL. The organic light-emitting diode OLED may be electrically connected to a pixel circuit. In the third area AR3, the organic light-emitting diode OLED may be electrically connected to the third pixel circuit PC3 to implement the third pixel PX3. According to some embodiments, the organic light-emitting diode OLED may overlap the third pixel circuit PC3. The organic light-emitting diode OLED may include a pixel electrode 211*a*, an intermediate layer 212*a*, and a counter electrode 213.

The pixel electrode 211*a* may be located on the organic insulating layer OIL. The pixel electrode 211*a* may be electrically connected to the second connection electrode CM2 through contact holes formed in the third organic insulating layer OIL3 and the fourth organic insulating layer OIL4. The pixel electrode 211*a* may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). According to some embodiments, the pixel electrode 211*a* may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. According to some embodiments, the pixel electrode 211*a* may further include a film formed of ITO, IZO, ZnO, or $In_2O_3$ over/under the reflective film.

The pixel defining layer 215 including an opening portion 215OP through which a central portion of the pixel electrode 211*a* is exposed may be located on the pixel electrode 211*a*. The opening portion 215OP may define an emission area of light emitted by the organic light-emitting diode OLED. The pixel-defining layer 215 may be formed of at least one organic insulating material selected from the group consisting of polyimide, polyamide, acrylic resin, benzocyclobutene, and phenolic resin. The pixel-defining layer 215 may include an organic insulating material. Alternatively, the pixel-defining layer 215 may include an inorganic insulating material such as silicon nitride, silicon oxynitride, or silicon oxide. Alternatively, the pixel-defining layer 215 may include an organic insulating material and an inorganic insulating material. In some embodiments, the pixel-defining layer 215 may include a light-blocking material, and may be black. The light-blocking material may include carbon black, carbon nanotubes, a resin or paste including a black dye, metal particles such as nickel, aluminum, molybdenum, or an alloy thereof, metal oxide particles (e.g., chromium oxide), or metal nitride particles (e.g., chromium nitride). When the pixel-defining layer 215 includes a light-blocking material, the reflection of external light due to metal structures located under the pixel-defining layer 215 may be reduced.

The intermediate layer 212*a* may include a low molecular weight material or a high molecular weight material, and may emit red light, green light, blue light, or white light. When the intermediate layer 212*a* includes a low molecular weight material, the intermediate layer 212*a* may have a single or stacked structure in which a hole injection layer (HIL), a hole transport layer (HTL), an emission layer (EML), an electron transport layer (ETL), and an electron injection layer (EIL) are stacked, and may include any of various organic materials such as copper phthalocyanine (CuPc), N,N'-Di(napthalene-1-yl)-N,N'-diphenyl-benzidine (NPB), or tris-8-hydroxyquinoline aluminum (Alq3). These layers may be formed by using vacuum deposition.

When the intermediate layer 212*a* includes a high molecular weight material, the intermediate layer 212*a* may have a structure including an HTL and an EML. In this case, the HTL may include poly(3,4-ethylenedioxythiophene) (PEDOT), and the EML may include a polymer material such as a polyphenylene vinylene (PPV)-based material or a polyfluorene-based material. The intermediate layer 212*a* may be formed by using screen printing, inkjet printing, laser-induced thermal imaging (LITI), or the like.

The counter electrode 213 may be located on the intermediate layer 212*a*. The counter electrode 213 may be formed of a conductive material having a low work function. For example, the counter electrode 213 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. Alternatively, the counter electrode 213 may further include a layer formed of ITO, IZO, ZnO, or $In_2O_3$ on the (semi) transparent layer including the above material.

Figure 6:
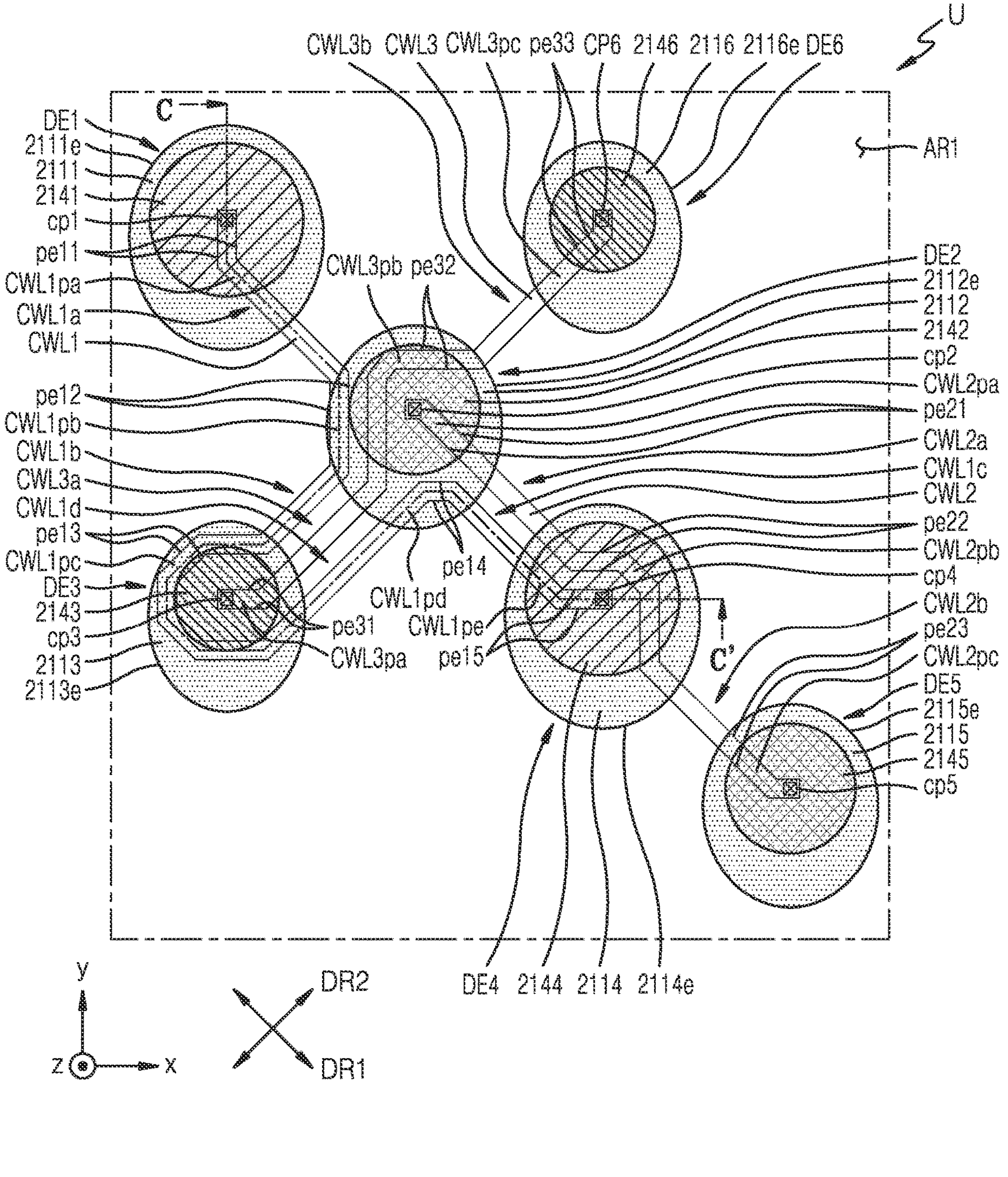
FIG. 6 is an enlarged plan view schematically illustrating a portion of a display panel, according to some embodiments.

FIG. 6 is an enlarged plan view schematically illustrating a portion of a display panel, according to some embodiments. In more detail, FIG. 6 is an enlarged plan view schematically illustrating a portion of the first area AR1 of FIG. 4.

Referring to FIG. 6, in the first area AR1, first to sixth display elements DE1, DE2, DE3, DE4, DE5, and DE6, and first to third connection wirings CWL1, CWL2, and CWL3 may be located.

The first to sixth display elements DE1, DE2, DE3, DE4, DE5, and DE6 may include the first pixel PX1 of FIG. 4. The first to third display elements DE1, DE2, and DE3 may emit light of different colors, and the fourth to sixth display elements DE4, DE5, and DE6 may emit light of different colors. For example, the first and fourth display elements DE1 and DE4 may emit light of a first color (e.g., blue), the second and fifth display elements DE2 and DE5 may emit light of a second color (e.g., green), and the third and sixth display elements DE3 and DE6 may emit light of a third color (e.g., red). A first emission area 2141 of the first display element DE1 and a fourth emission area 2144 of the fourth display element DE4 may emit light of the first color, a second emission area 2142 of the second display element DE2 and a fifth emission area 2145 of the fifth display element DE5 may emit light of the second color, and a third emission area 2143 of the third display element DE3 and a sixth emission area 2146 of the sixth display element DE6 may emit light of the third color.

The first display element DE1 may include a first pixel electrode 2111, and the second display element DE2 may include a second pixel electrode 2112. The third display element DE3 may include a third pixel electrode 2113, and the fourth display element DE4 may include a fourth pixel electrode 2114. The fifth display element DE5 may include a fifth pixel electrode 2115, and the sixth display element DE6 may include a sixth pixel electrode 2116.

The first emission area 2141 of the first display element DE1 may be defined by an opening of the pixel defining layer 215 (see FIG. 5) through which the first pixel electrode 2111 is exposed. The second emission area 2142 of the second display element DE2 may be defined by an opening of the pixel defining layer 215 through which the second pixel electrode 2112 is exposed. The third emission area 2143 of the third display element DE3 may be defined by an opening of the pixel defining layer 215 through which the third pixel electrode 2113 is exposed. The fourth emission area 2144 of the fourth display element DE4 may be defined by an opening of the pixel defining layer 215 through which the fourth pixel electrode 2114 is exposed. The fifth emission area 2145 of the fifth display element DE5 may be defined by an opening of the pixel defining layer 215 through which the fifth pixel electrode 2115 is exposed. The sixth emission area 2146 of the sixth display element DE6 may be defined by an opening of the pixel defining layer 215 through which the sixth pixel electrode 2116 is exposed.

According to some embodiments, as shown in FIG. 6, the first display element DE1, the second display element DE2, the fourth display element DE4, and the fifth display element DE5 may be sequentially arranged in a first direction DR1. The third display element DE3, the second display element DE2, and the sixth display element DE6 may be sequentially arranged in a second direction DR2 that intersects the first direction DR1.

According to some embodiments, a plurality of first to sixth display elements DE1 to DE6 may be provided. In this case, a sum of the number of first display elements DE1 and the number of fourth display elements DE4 per unit area may be the same as a sum of the number of second display elements DE2 and the number of fifth display elements DE5 per unit area. A sum of the number of second display elements DE2 and the number of fifth display elements DE5 per unit area may be the same as a sum of the number of third display elements DE3 and the number of sixth display elements DE6 per unit area.

Figure 7:
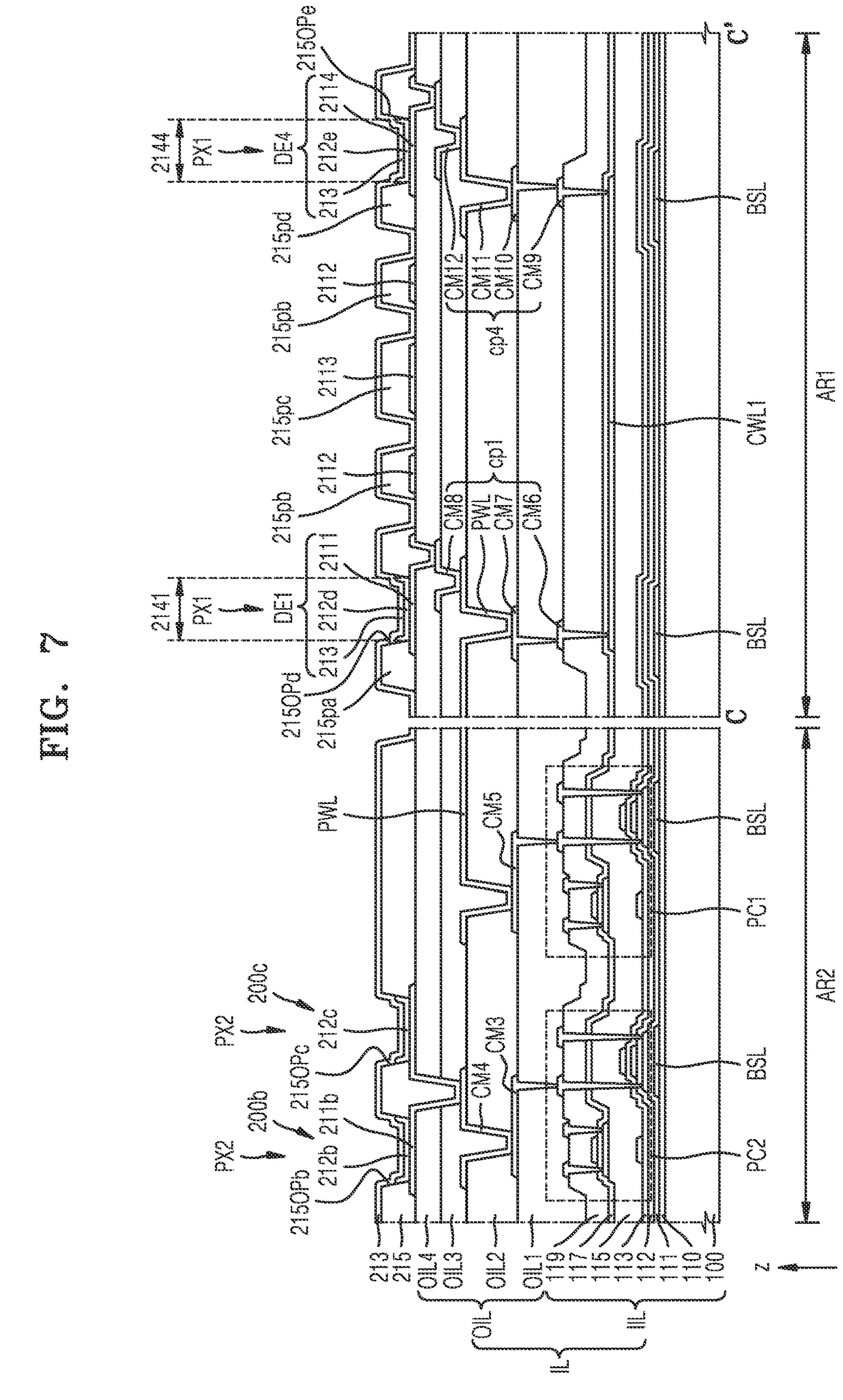
FIG. 7 is a cross-sectional view taken along the line C-C' of a portion of the display panel of FIG. 6 according to some embodiments.

The first connection wiring CWL1 may connect the first pixel electrode 2111 of the first display element DE1 to the fourth pixel electrode 2114 of the fourth display element DE4. An end of the first connection wiring CWL1 may be connected to the first pixel electrode 2111 of the first display element DE1 through a first contact portion cp1, and the other end of the first connection wiring CWL1 may be connected to the fourth pixel electrode 2114 of the fourth display element DE4 through a fourth contact portion cp4. Each of the first contact portion cp1 and the fourth contact portion cp4 may include a plurality of connection electrodes (or connection wirings) as shown in FIG. 7.

The second connection wiring CWL2 may connect the second pixel electrode 2112 of the second display element DE2 to the fifth pixel electrode 2115 of the fifth display element DE5. An end of the second connection wiring CWL2 may be connected to the second pixel electrode 2112 of the second display element DE2 through a second contact portion cp2, and the other end of the second connection wiring CWL2 may be connected to the fifth pixel electrode 2115 of the fifth display element DE5 through a fifth contact portion cp5. Each of the second contact portion cp2 and the fifth contact portion cp5 may include a plurality of connection electrodes (or connection wirings).

The third connection wiring CWL3 may connect the third pixel electrode 2113 of the third display element DE3 to the sixth pixel electrode 2116 of the sixth display element DE6. An end of the third connection wiring CWL3 may be connected to the third pixel electrode 2113 of the third display element DE3 through a third contact portion cp3, and the other end of the third connection wiring CWL3 may be connected to the sixth pixel electrode 2116 of the sixth display element DE6 through a sixth contact portion cp6. Each of the third contact portion cp3 and the sixth contact portion cp6 may include a plurality of connection electrodes (or connection wirings).

According to some embodiments, the first connection wiring CWL1 may at least partially overlap the first pixel electrode 2111 of the first display element DE1, the second pixel electrode 2112 of the second display element DE2, the third pixel electrode 2113 of the third display element DE3, and the fourth pixel electrode 2114 of the fourth display element DE4.

For example, the first connection wiring CWL1 may include a first portion CWL1*pa* overlapping the first pixel electrode 2111, a second portion CWL1*pb* overlapping a part of the second pixel electrode 2112, a third portion CWL1*pc* overlapping the third pixel electrode 2113, a fourth portion CWL1*pd* overlapping another part of the second pixel electrode 2112, and a fifth portion CWL1*pe* overlapping the fourth pixel electrode 2114. In this case, as shown in FIG. 6, the first to fifth portions CWL1*pa*, CWL1*pb*, CWL1*pc*, CWL1*pd*, and CWL1*pe* of the first connection wiring CWL1 may be sequentially arranged in the first connection wiring CWL1.

According to some embodiments, a first portion edge pe11 of the first portion CWL1*pa* of the first connection wiring CWL1 may be located in a first edge 2111*e* of the first pixel electrode 2111. A second portion edge pe12 of the second portion CWL1*pb* of the first connection wiring CWL1 may be located in a second edge 2112*e* of the second pixel electrode 2112. A third portion edge pe13 of the third portion CWL1*pc* of the first connection wiring CWL1 may be located in a third edge 2113*e* of the third pixel electrode 2113. A fourth portion edge pe14 of the fourth portion CWL1*pd* of the first connection wiring CWL1 may be located in the second edge 2112*e* of the second pixel electrode 2112. A fifth portion edge pe15 of the fifth portion CWL1*pe* of the first connection wiring CWL1 may be located in a fourth edge 2114*e* of the fourth pixel electrode 2114.

According to some embodiments, the second connection wiring CWL2 may at least partially overlap the second pixel electrode 2112 of the second display element DE2, the fourth pixel electrode 2114 of the fourth display element DE4, and the fifth pixel electrode 2115 of the fifth display element DE5.

For example, the second connection wiring CWL2 may include a first portion CWL2*pa* overlapping the second pixel electrode 2112, a second portion CWL2*pb* overlapping the fourth pixel electrode 2114, and a third portion CWL2*pc* overlapping the fifth pixel electrode 2115. In this case, as shown in FIG. 6, the first to third portions CWL2*pa*, CWL2*pb*, and CWL2*pc* of the second connection wiring CWL2 may be sequentially arranged in the second connection wiring CWL2.

According to some embodiments, a first portion edge pe21 of the first portion CWL2*pa* of the second connection wiring CWL2 may be located in the second edge 2112*e* of the second pixel electrode 2112. A second portion edge pe22 of the second portion CWL2*pb* of the second connection wiring CWL2 may be located in the fourth edge 2114*e* of the fourth pixel electrode 2114. A third portion edge pe23 of the third portion CWL2*pc* of the second connection wiring CWL2 may be located in a fifth edge 2115*e* of the fifth pixel electrode 2115.

According to some embodiments, the third connection wiring CWL3 may at least partially overlap the third pixel electrode 2113 of the third display element DE3, the second pixel electrode 2112 of the second display element DE2, and the sixth pixel electrode 2116 of the sixth display element DE6.

For example, the third connection wiring CWL3 may include a first portion CWL3*pa* overlapping the third pixel electrode 2113, a second portion CWL3*pb* overlapping the second pixel electrode 2112, and a third portion CWL3*pc* overlapping the sixth pixel electrode 2116. In this case, as shown in FIG. 6, the first to third portions CWL3*pa*, CWL3*pb*, and CWL3*pc* of the third connection wiring CWL3 may be sequentially arranged in the third connection wiring CWL3.

According to some embodiments, a first portion edge pe31 of the first portion CWL3*pa* of the third connection wiring CWL3 may be located in the third edge 2113*e* of the third pixel electrode 2113. A second portion edge pe32 of the second portion CWL3*pb* of the third connection wiring CWL3 may be located in the second edge 2112*e* of the second pixel electrode 2112. A third portion edge pe33 of the third portion CWL3*pc* of the third connection wiring CWL3 may be located in a sixth edge 2116*e* of the sixth pixel electrode 2116.

According to some embodiments, the first connection wiring CWL1 may surround at least a part of the third contact portion cp3. The third contact portion cp3 may connect the third connection wiring CWL3 to the third pixel electrode 2113 as described above. The second connection wiring CWL2 may surround at least a part of the fourth contact portion cp4. The fourth contact portion cp4 may connect the first connection wiring CWL1 to the fourth pixel electrode 2114 as described above. The third connection wiring CWL3 may surround at least a part of the second contact portion cp2. The second contact portion cp2 may connect the second connection wiring CWL2 to the second pixel electrode 2112 as described above.

According to some embodiments, the first connection wiring CWL1 may include a first connection portion CWL1*a*, a second connection portion CWL1*b*, a third connection portion CWL1*c*, and a fourth connection portion CWL1*d*. The first connection portion CWL1*a* may extend in the first direction DR1 and may be connected to the first pixel electrode 2111. The second connection portion CWL1*b* may extend from the first connection portion CWL1*a* in the second direction DR2. The third connection portion CWL1*c* may extend in the first direction DR1 and may be connected to the fourth pixel electrode 2114. The fourth connection portion CWL1*d* may extend from the third connection portion CWL1*c* in the second direction DR2.

According to some embodiments, the second connection wiring CWL2 may include a fifth connection portion CWL2*a* and a sixth connection portion CWL2*b*. The fifth connection portion CWL2*a* may extend in the first direction DR1, may be connected to the second pixel electrode 2112, and may be adjacent to the third connection portion CWL1*c* of the first connection wiring CWL1. The sixth connection portion CWL2*b* may extend in the first direction DR1 and may be connected to the fifth pixel electrode 2115.

According to some embodiments, the third connection wiring CWL3 may include a seventh connection portion CWL3*a* and an eighth connection portion CWL3*b*. The seventh connection portion CWL3*a* may extend in the second direction DR2, may be connected to the third pixel electrode 2113, and may be located between the second connection portion CWL1*b* and the fourth connection portion CWL1*d* of the first connection wiring CWL1. The eighth connection portion CWL3*b* may extend in the second direction DR2 and may be connected to the sixth pixel electrode 2116.

The first to sixth display elements DE1, DE2, DE3, DE4, DE5, and DE6, and the first to third connection wirings CWL1, CWL2, and CWL3 may constitute one unit U. A plurality of units U may be provided, and the plurality of units U may be arranged in the x direction and the y direction.

In one unit U, when the first to sixth display elements DE1, DE2, DE3, DE4, DE5, and DE6 and the first to third connection wirings CWL1, CWL2, and CWL3 are arranged as shown in FIG. 6, a ratio at which connection wirings overlap pixel electrodes may increase. As a ratio at which connection wirings and pixel electrodes overlap each other increases, visibility of the connection wirings may decrease. Also, a ratio of an area where the units U are not located in the first area AR1 may increase. Because an area where the units U are not located may correspond to a transmissive area where external light may be transmitted, a ratio of a transmissive area may increase. Accordingly, a transmittance of the first area AR1 may increase.

According to some embodiments, the first to third connection wirings CWL1, CWL2, and CWL3 may include an oxide semiconductor material. For example, each of the first to third connection wirings CWL1, CWL2, and CWL3 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn).

According to some embodiments, each of the first to third connection wirings CWL1, CWL2, and CWL3 may include a metal material. Each of the first to third connection wirings CWL1, CWL2, and CWL3 may include a conductive material including molybdenum (Mo), aluminum (Al), copper (Cu), or titanium (Ti), and may have a single or multi-layer structure including the above material.

Because the first to third connection wirings CWL1, CWL2, and CWL3 at least partially overlap pixel electrodes, even when the first to third connection wirings CWL1, CWL2, and CWL3 include a metal material, a transmittance of the first area AR1 may be ensured.

FIG. 7 is a cross-sectional view taken along the line C-C' of a portion of the display panel of FIG. 6. In more detail, FIG. 7 is a cross-sectional view illustrating a portion of the second area AR2 of FIG. 4, and a portion of the first portion AR1 of FIG. 6 taken along the line C-C'. In FIG. 7, the same members as those in FIG. 5 are denoted by the same reference numerals, and thus, a repeated description thereof will be omitted.

Referring to FIG. 7, the first pixels PX1 may be located in the first area AR1, and the first pixel circuit PC1, the second pixel circuit PC2, and the second pixels PX2 may be located in the second area AR2. The description of the third pixel circuit PC3 of FIG. 5 may be applied to the first pixel circuit PC1 and the second pixel circuit PC2.

The first pixels PX1 may be implemented by the first display element DE1 and the fourth display element DE4. The first display element DE1 may include the first pixel electrode 2111, a first intermediate layer 212*d*, and the counter electrode 213, and the fourth display element DE4 may include the fourth pixel electrode 2114, a fourth intermediate layer 212*e*, and the counter electrode 213. Each of the first intermediate layer 212*d* and the second intermediate layer 212*e* may include a high molecular weight material or a low molecular weight material, and may emit red light, green light, blue light, or white light. For example, each of the first intermediate layer 212*d* and the second intermediate layer 212*e* may emit blue light.

The second pixels PX2 may be implemented by a seventh display element 200*b* and an eighth display element 200*c* located in the second area AR2. The seventh display element 200*b* may include a seventh pixel electrode 211*b*, a third intermediate layer 212*b*, and the counter electrode 213, and the eighth display element 200*c* may include the seventh pixel electrode 211*b*, a fourth intermediate layer 212*c*, and the counter electrode 213. The seventh display element 200*b* and the eighth display element 200*c* may share the seventh pixel electrode 211*b*. Each of the third intermediate layer 212*b* and the fourth intermediate layer 212*c* may include a low molecular weight material or a high molecular weight material, and may emit red light, green light, blue light, or white light.

According to some embodiments, the first display element DE1 and the fourth display element DE4 may be electrically connected to the first pixel circuit PC1 located in the second area AR2. The first display element DE1 and the fourth display element DE4 may be driven by the first pixel circuit PC1. The first pixel circuit PC1 may be connected to at least one of the first display element DE1 or the fourth display element DE4 through a circuit connection wiring PWL. For example, as shown in FIG. 7, the first pixel circuit PC1 may be connected to the first display element DE1 through the circuit connection wiring PWL. In more detail, the first pixel circuit PC1 may be connected to the circuit connection wiring PWL through a fifth connection electrode CM5, and the first pixel electrode 2111 of the first display element DE1 may be connected to the circuit connection wiring PWL through an eighth connection electrode CM8.

The circuit connection wiring PWL may overlap the first area AR1 and the second area AR2. The circuit connection wiring PWL may be located on the second organic insulating layer OIL2. The circuit connection wiring PWL may include a transparent conductive material. For example, the circuit connection wiring PWL may include a transparent conductive oxide (TCO). The circuit connection wiring PWL may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

The fifth connection electrode CM5 may be located on the first organic insulating layer OIL1. The fifth connection electrode CM5 may include a material having excellent conductivity. The fifth connection electrode CM5 may include a conductive material including molybdenum (Mo), aluminum (Al), copper (Cu), or titanium (Ti), and may have a single or multi-layer structure including the above material. According to some embodiments, the fifth connection electrode CM5 may have a multi-layer structure including Ti/Al/Ti.

The eighth connection electrode CM8 may be located on the third organic insulating layer OIL3. The eighth connection electrode CM8 may include a transparent conductive material. For example, the eighth connection electrode CM8 may include a transparent conductive oxide (TCO). The eighth connection electrode CM8 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

According to some embodiments, the fourth display element DE4 may be electrically connected to the first display element DE1. The fourth pixel electrode 2114 of the fourth display element DE4 may be electrically connected to the first pixel electrode 2111 of the first display element DE1. For example, as shown in FIG. 7, the first pixel electrode 2111 of the first display element DE1 and the fourth pixel electrode 2114 of the fourth display element DE4 may be connected to each other through the first contact portion cp1, the first connection wiring CWL1, and the fourth contact portion cp4. The first pixel electrode 2111 of the first display element DE1 may be connected to the first connection wiring CWL1 through the first contact portion cp1, and the fourth pixel electrode 2114 of the fourth display element DE4 may be connected to the first connection wiring CWL1 through the fourth contact portion cp4. The first contact portion cp1 may include a sixth connection electrode CM6, a seventh connection electrode CM7, at least a part of the circuit connection wiring PWL, and the eighth connection electrode CM8. The fourth contact portion cp4 may include a ninth connection electrode CM9, a tenth connection electrode CM10, an $11^{th}$ connection electrode CM11, and a $12^{th}$ connection electrode CM12.

The first connection wiring CWL1 may be located between the first inorganic insulating layer 115 and the second inorganic insulating layer 117. The first connection wiring CWL1 and a semiconductor layer of the first pixel circuit PC1 may be located on the same layer. The first connection wiring CWL1 may include an oxide semiconductor material. For example, the first connection wiring CWL1 may be formed of a Zn oxide-based material such as Zn oxide, In—Zn oxide, or Ga—In—Zn oxide. Alternatively, the first connection wiring CWL1 may be formed of an In—Ga—Zn—O (IGZO), In—Sn—Zn—O (ITZO), or In—Ga—Sn—Zn—O (IGTZO) semiconductor in which a metal such as indium (In), gallium (Ga), or tin (Sn) is contained in zinc oxide (ZnO). According to some embodiments, as shown in FIG. 6, the first connection wiring CWL1 may at least partially overlap the first pixel electrode 2111, the second pixel electrode 2112, the third pixel electrode 2113, and the fourth pixel electrode 2114. According to some embodiments, as shown in FIGS. 6 and 7, the first connection wiring CWL1 may be located under the first pixel electrode 2111, the second pixel electrode 2112, the third pixel electrode 2113, and the fourth pixel electrode 2114, and continuously extend beneath and overlap each of the first pixel electrode 2111, the second pixel electrode 2112, the third pixel electrode 2113, and the fourth pixel electrode 2114 in a thickness direction of the display apparatus.

The sixth connection electrode CM6 and the ninth connection electrode CM9 may be located on the interlayer insulating layer 119. The seventh connection electrode CM7 and the tenth connection electrode CM10 may be located on the first organic insulating layer OIL1. Each of the sixth connection electrode CM6, the seventh connection electrode CM7, the ninth connection electrode CM9, and the tenth connection electrode CM10 may include a material having excellent conductivity. Each of the sixth connection electrode CM6, the seventh connection electrode CM7, the ninth connection electrode CM9, and the tenth connection electrode CM10 may include a conductive material including molybdenum (Mo), aluminum (Al), copper (Cu), or titanium (Ti), and may have a single or multi-layer structure including the above material. According to some embodiments, each of the sixth connection electrode CM6, the seventh connection electrode CM7, the ninth connection electrode CM9, and the tenth connection electrode CM10 may have a multi-layer structure including Ti/Al/Ti.

The $11^{th}$ connection electrode CM11 may be located on the second organic insulating layer OIL2, and the $12^{th}$ connection electrode CM12 may be located on the third organic insulating layer OIL3. Each of the 11$^{th}$ connection electrode CM11 and the 12$^{th}$ connection electrode CM12 may include a transparent conductive material. For example, each of the 11$^{th}$ connection electrode CM11 and the 12$^{th}$ connection electrode CM12 may include a transparent conductive oxide (TCO). Each of the 11$^{th}$ connection electrode CM11 and the 12$^{th}$ connection electrode CM12 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

According to some embodiments, the seventh display element 200*b* and the eighth display element 200*c* may be electrically connected to the second pixel circuit PC2 located in the second area AR2. The seventh display element 200*b* and the eighth display element 200*c* may be driven by the second pixel circuit PC2. For example, as shown in FIG. 7, the second pixel circuit PC2 may be connected to the seventh pixel electrode 211*b* shared by the seventh display element 200*b* and the eighth display element 200*c* through the third connection electrode CM3 and the fourth connection electrode CM4.

The third connection electrode CM3 may be located on the first organic insulating layer OIL1. The third connection electrode CM3 may include a material having excellent conductivity. The third connection electrode CM3 may include a conductive material including molybdenum (Mo), aluminum (Al), copper (Cu), or titanium (Ti), and may have a single or multi-layer structure including the above material. According to some embodiments, the third connection electrode CM3 may have a multi-layer structure including Ti/Al/Ti.

The fourth connection electrode CM4 may be located on the second organic insulating layer OIL2. The fourth connection electrode CM4 may include a transparent conductive material. For example, the fourth connection electrode CM4 may include a transparent conductive oxide (TCO). The fourth connection electrode CM4 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

According to some embodiments, the pixel defining layer 215 may include a first to fourth opening portions 215OPb, 215OPc, 215OPd, and 215OPe. The first opening portion 215OPb may expose a part of the seventh pixel electrode 211*b*, and the second opening portion 215OPc may expose another part of the seventh pixel electrode 211*b*. The third opening portion 215OPd may expose a part of the first pixel electrode 2111, and the fourth opening portion 215OPe may expose a part of the fourth pixel electrode 2114. The third opening portion 215OPd may define the first emission area 2141 of the first display element DE1, and the fourth opening portion 215OPe may define the fourth emission area 2144 of the fourth display element DE4.

According to some embodiments, the pixel defining layer 215 may include first to fourth portions 215*pa*, 215*pb*, 215*pc*, and 215*pd* located in the first area AR1. The first portion 215*pa* of the pixel defining layer 215 may cover at least a part of the first pixel electrode 2111. For example, the first portion 215*pa* of the pixel defining layer 215 may cover an edge of the first pixel electrode 2111. The second portion 215*pb* of the pixel defining layer 215 may cover at least a part of the second pixel electrode 2112, the third portion 215*pc* of the pixel defining layer 215 may cover at least a part of the third pixel electrode 2113, and the fourth portion 215*pd* of the pixel defining layer 215 may cover at least a part of the fourth pixel electrode 2114.

As shown in FIG. 7, the lower shielding layer BSL may be located in the first area AR1 and the second area AR2. The lower shielding layer BSL may at least partially overlap the first pixel circuit PC1, the second pixel circuit PC2, the first display element DE1, and the fourth display element DE4.

Figure 8:
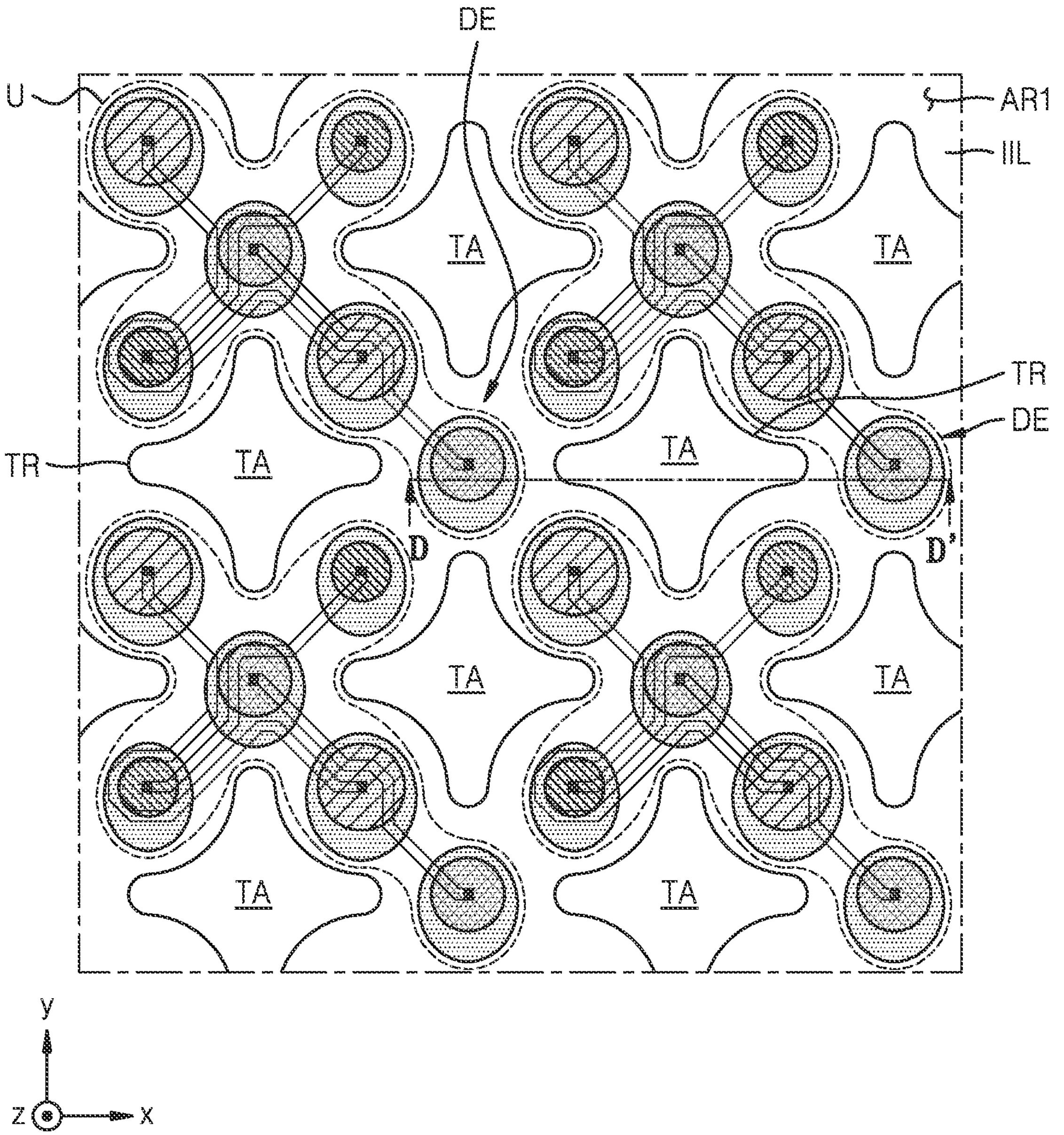
FIG. 8 is an enlarged plan view schematically illustrating a portion of a display panel, according to some embodiments.

FIG. 8 is an enlarged plan view schematically illustrating a portion of a display panel, according to some embodiments. In more detail, FIG. 8 is an enlarged plan view schematically illustrating a portion of the first area AR1 of FIG. 4.

Referring to FIG. 8, in the first area AR1, the units U described with reference to FIG. 6 may be arranged in the x direction and the y direction. Each of the units U may include a plurality of display elements DE. In the first area AR1, an area where the units U are not located may correspond to a transmissive area TA through which external light may be transmitted.

According to some embodiments, the inorganic insulating layer (or the first insulating layer) IIL may include a trench TR corresponding to the transmissive area TA. A plurality of trenches TR may be provided, and the plurality of trenches TR may surround at least parts of the units U. The trenches TR may surround at least parts of the display elements DE in the unit U. The trenches TR may be arranged in the x direction and the y direction. When the inorganic insulating layer IIL includes the trench TR corresponding to the transmissive area TA of the first area AR1, a transmittance of the first area AR1 may further increase.

According to some embodiments, a planar shape of each of the trenches TR may be a substantially cross shape. For example, as shown in FIG. 8, a planar shape of each of the trenches TR may be a cross shape with round corners.

Figure 9:
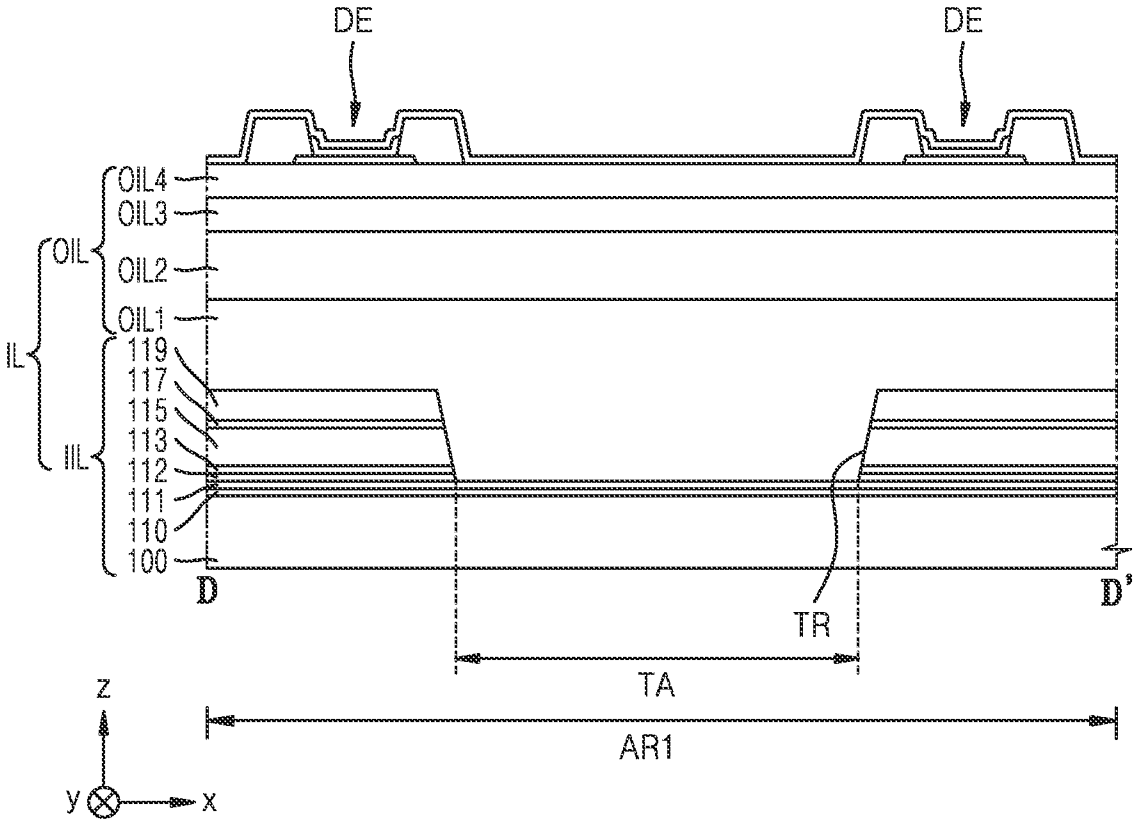
FIG. 9 is a cross-sectional view taken along the line D-D' of a portion of the display panel of FIG. 8 according to some embodiments.

FIG. 9 is a cross-sectional view taken along the line D-D' of a portion of the display panel of FIG. 8. In FIG. 9, the same elements as those in FIG. 5 are denoted by the same reference numerals, and thus, a repeated description thereof will be omitted.

Referring to FIG. 9, the inorganic insulating layer IIL located under the display elements DE may include the trench TR. The trench TR may correspond to the transmissive area TA. The trench TR may be located between the display elements DE.

According to some embodiments, the trench TR may be formed by etching (or removing) at least a part of the inorganic insulating layer IIL. For example, the trench TR may be formed by etching at least parts of the first gate insulating layer 112, the second gate insulating layer 113, the first inorganic insulating layer 115, the second inorganic insulating layer 117, and the interlayer insulating layer 119.

According to some embodiments, at least a part of the organic insulating layer (or the second insulating layer) OIL located between the display elements DE and the inorganic insulating layer IIL may be located in the trench TR of the inorganic insulating layer IIL. For example, at least a part of the first organic insulating layer OIL1 may be located in the trench TR of the inorganic insulating layer IIL.

Figure 10:
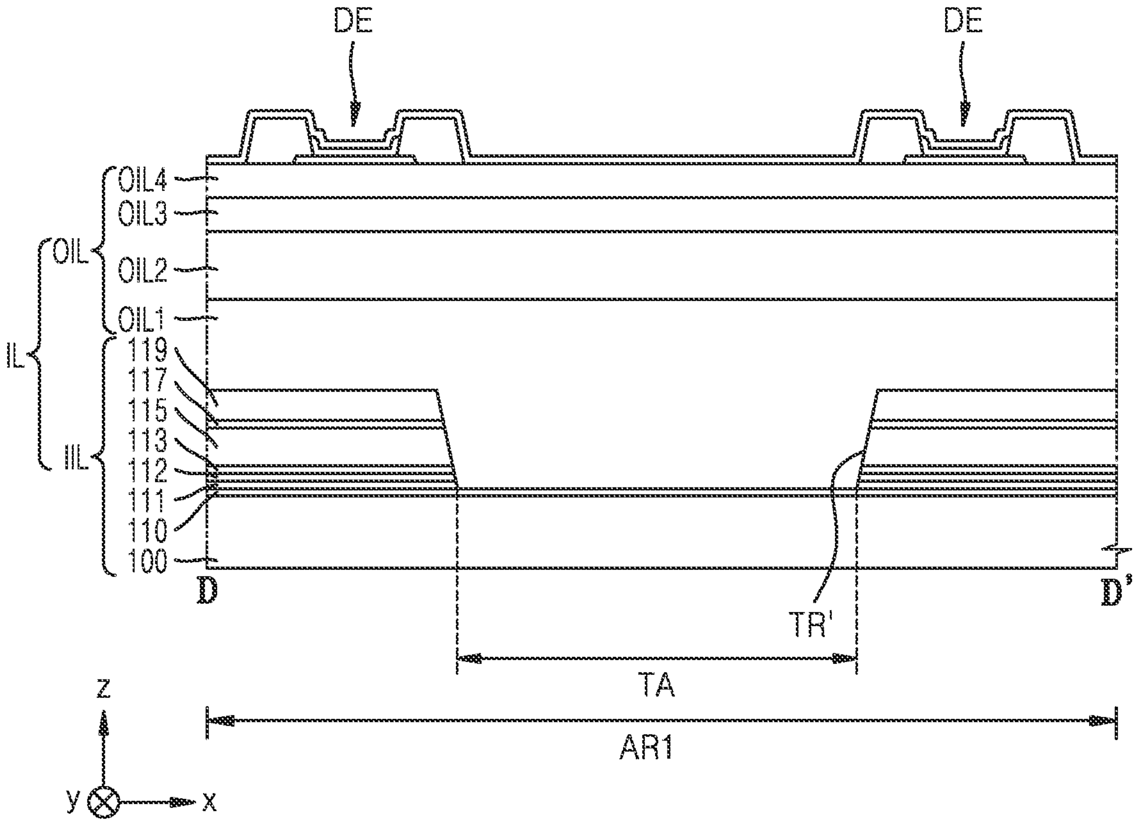
FIG. 10 is a cross-sectional view taken along the line D-D' of a portion of the display panel of FIG. 8 according to some embodiments.

FIG. 10 is a cross-sectional view taken along the line D-D' of a portion of the display panel of FIG. 8. FIG. 10 is a modification of FIG. 9, and is different in a structure of a trench. The same description as that made with reference to FIG. 9 will be omitted, and the following will focus on a difference.

Referring to FIG. 10, a trench TR' may correspond to the transmissive area TA. The trench TR' may be formed by etching (or removing) at least a part of the inorganic insulating layer IIL. For example, the trench TR' may be formed by etching at least parts of the buffer layer 111, the first gate insulating layer 112, the second gate insulating layer 113, the first inorganic insulating layer 115, the second organic insulating layer 117, and the interlayer insulating layer 119.

Figure 11:
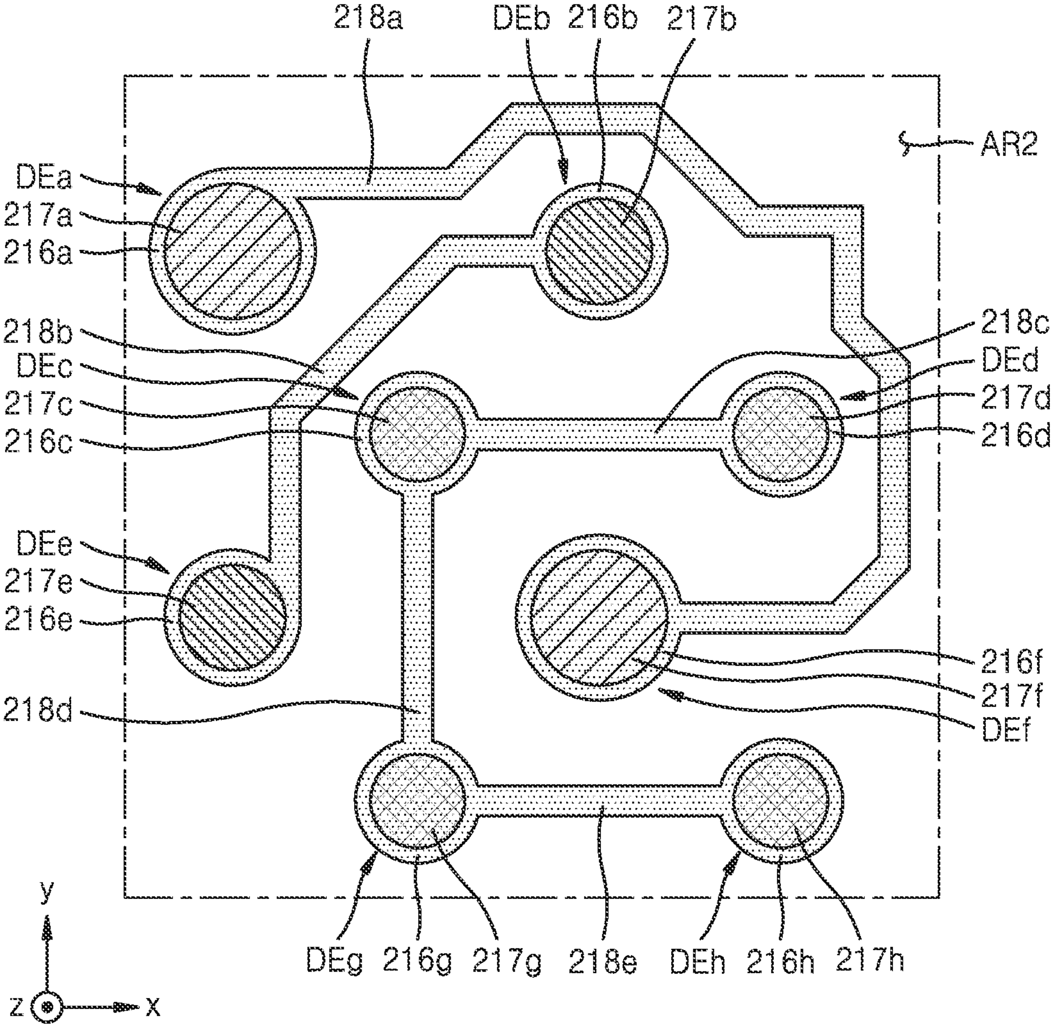
FIG. 11 is an enlarged plan view schematically illustrating a portion of a display panel, according to some embodiments.

FIG. 11 is an enlarged plan view schematically illustrating a portion of a display panel, according to some embodiments. In more detail, FIG. 11 is an enlarged plan view schematically illustrating a portion of the second area AR2 of FIG. 4.

Referring to FIG. 11, in the second area AR2, first to eighth display elements DEa, DEb, DEc, DEd, DEe, DEf, DEg, and DEh and first to fifth connection wirings 218*a*, 218*b*, 218*c*, 218*d*, and 218*e* may be located.

The first to eighth display elements DEa, DEb, DEc, DEd, DEe, DEf, DEg, and DEh may implement the second pixel PX2 of FIG. 4. The first to eighth display elements DEa, DEb, DEc, DEd, DEe, DEf, DEg, and DEh may emit blue light, green light, or red light. For example, the first display element DEa and the sixth display element DEf may emit blue light, the second display element DEb and the fifth display element DEe may emit red light, and the third display element DEc, the fourth display element DEd, the seventh display element DEg, and the eighth display element DEh may emit green light. A first emission area 217*a* of the first display element DEa and a sixth emission area 217*f* of the sixth display element DEf may emit blue light, a second emission area 217*b* of the second display element DEb and a fifth emission area 217*e* of the fifth display element DEe may emit red light, and a third emission area 217*c* of the third display element DEc, a fourth emission area 217*d* of the fourth display element DEd, a seventh emission area 217*g* of the seventh display element DEg, and an eighth emission area 217*h* of the eighth display element DEh may emit green light.

The first display element DEa may include a first pixel electrode 216*a*, and the second display element DEb may include a second pixel electrode 216*b*. The third display element DEc may include a third pixel electrode 216*c*, and the fourth display element DEd may include a fourth pixel electrode 216*d*. The fifth display element DEe may include a fifth pixel electrode 216*e*, and the sixth display element DEf may include a sixth pixel electrode 216*f*. The seventh display element DEg may include a seventh pixel electrode 216*g*, and the eighth display element DEh may include an eighth pixel electrode 216*h*.

The first emission area 217*a* of the first display element DEa may be defined by an opening of the pixel defining layer 215 (see FIG. 5) through which the first pixel electrode 216*a* is exposed. The second emission area 217*b* of the second display element DEb may be defined by an opening of the pixel defining layer 215 through which the second pixel electrode 216*b* is exposed. The third emission area 217*c* of the third display element DEc may be defined by an opening of the pixel defining layer 215 through which the third pixel electrode 216*c* is exposed. The fourth emission area 217*d* of the fourth display element DEd may be defined by an opening of the pixel defining layer 215 through which the fourth pixel electrode 216*d* is exposed. The fifth emission area 217*e* of the fifth display element DEe may be defined by an opening of the pixel defining layer 215 through which the fifth pixel electrode 216*e* is exposed. The sixth emission area 217*f* of the sixth display element DEf may be defined by an opening of the pixel defining layer 215 through which the sixth pixel electrode 216*f* is exposed.

According to some embodiments, as shown in FIG. 11, the first to eighth display elements DEa, DEb, DEc, DEd, DEe, DEf, DEg, and DEh may be arranged in a pentile type. For example, a plurality of first to eighth display elements DEa, DEb, DEc, DEd, DEe, DEf, DEg, and DEh may be provided. The first display elements DEa and the second display elements DEb may be alternately arranged in the x direction. The third display elements DEc and the fourth display elements DEd may be alternately arranged in the x direction. The fifth display elements DEe ad the sixth display elements DEf may be alternately arranged in the x direction. The seventh display elements DEg and the eighth display elements DEh may be alternately arranged in the x direction. The first display elements DEa and the fifth display elements DEe may be alternately arranged in the y direction. The third display elements DEc and the seventh display elements DEg may be alternately arranged in the y direction. The second display elements DEb and the sixth display elements DEf may be alternately arranged in the y direction. The fourth display elements DEd and the eighth display elements DEh may be alternately arranged in the y direction.

According to some embodiments, a plurality of first to eighth display elements DEa, DEb, DEc, DEd, DEe, DEf, DEg, and DEh may be provided. In this case, a sum of the number of first display elements DEa and the number of sixth display elements DEf per unit area may be the same as a sum of the number of second display elements DEb and the number of fifth display elements DEe per unit area. A sum of the number of second display elements DEb and the number of fifth display elements DEe per unit area may be less than a sum of the number of third display elements DEc, the number of fourth display elements DEd, the number of seventh display elements DEg, and the number of eighth display elements DEh per unit area.

The first connection wiring 218*a* may connect the first pixel electrode 216*a* of the first display element DEa to the sixth pixel electrode 216*f* of the sixth display element DEf. According to some embodiments, the first connection wiring 218*a*, the first pixel electrode 216*a*, and the sixth pixel electrode 216*f* may be integrally formed.

The second connection wiring 218*b* may connect the second pixel electrode 216*b* of the second display element DEb to the fifth pixel electrode 216*e* of the fifth display element DEe. According to some embodiments, the second connection wiring 218*b*, the second pixel electrode 216*b*, and the fifth pixel electrode 216*e* may be integrally formed.

The third connection wiring 218*c* may connect the third pixel electrode 216*c* of the third display element DEc to the fourth pixel electrode 216*d* of the fourth display element DEd. According to some embodiments, the third connection wiring 218*c*, the third pixel electrode 216*c*, and the fourth pixel electrode 216*d* may be integrally formed.

The fourth connection wiring 218*d* may connect the third pixel electrode 216*c* of the third display element DEc to the seventh pixel electrode 216*g* of the seventh display element DEg. According to some embodiments, the fourth connection wiring 218*d*, the third pixel electrode 216*c*, and the seventh pixel electrode 216*g* may be integrally formed.

The fifth connection wiring 218*e* may connect the seventh pixel electrode 216*g* of the seventh display element DEg to the eighth pixel electrode 216*h* of the eighth display element DEh. According to some embodiments, the fifth connection wiring 218*e*, the seventh pixel electrode 216*g*, and the eighth pixel electrode 216*h* may be integrally formed.

An arrangement of display elements and connection wirings in the second area AR2 may be the same as an arrangement in FIG. 6, unlike in FIG. 11.

Although only a display apparatus has been mainly described, the disclosure is not limited thereto. For example, a method of manufacturing the display apparatus may also be within the scope of the disclosure.

According to the one or more embodiments, a display apparatus in which a high transmittance and a high resolution may be maintained may be realized. However, the scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope as defined by the following claims, and their equivalents.

What is claimed is:

1. A display apparatus comprising:

a first display element configured to emit light of a first color and comprising a first pixel electrode;

a second display element configured to emit light of a second color that is different from the first color and comprising a second pixel electrode;

a third display element configured to emit light of a third color that is different from the first color and the second color and comprising a third pixel electrode;

a fourth display element configured to emit light of the first color and comprising a fourth pixel electrode; and a first connection wiring under the first to fourth pixel electrodes and continuously extending beneath and overlapping each of the first pixel electrode, the second pixel electrode, the third pixel electrode, and the fourth pixel electrode in a thickness direction of the display apparatus, configured to connect the first pixel electrode to the fourth pixel electrode, and at least partially overlapping the first to fourth pixel electrodes, and comprising an oxide semiconductor material.

2. The display apparatus of claim 1, further comprising:

a fifth display element configured to emit light of the second color and comprising a fifth pixel electrode; and a second connection wiring configured to connect the second pixel electrode to the fifth pixel electrode, wherein the first display element, the second display element, the fourth display element, and the fifth display element are sequentially arranged in a first direction.

3. The display apparatus of claim 2, wherein the second connection wiring at least partially overlaps the second pixel electrode, the fourth pixel electrode, and the fifth pixel electrode.

4. The display apparatus of claim 2, further comprising:

a sixth display element configured to emit light of the third color and comprising a sixth pixel electrode; and a third connection wiring configured to connect the third pixel electrode to the sixth pixel electrode, wherein the third display element, the second display element, and the sixth display element are sequentially arranged in a second direction that intersects the first direction.

5. The display apparatus of claim 4, wherein the third connection wiring at least partially overlaps the second pixel electrode, the third pixel electrode, and the sixth pixel electrode.

6. The display apparatus of claim 4, wherein the second connection wiring at least partially overlaps the second pixel electrode, the fourth pixel electrode, and the fifth pixel electrode, and the third connection wiring at least partially overlaps the second pixel electrode, the third pixel electrode, and the sixth pixel electrode, wherein a first portion edge of a first portion of the first connection wiring overlapping the second pixel electrode is at a first edge of the second pixel electrode, a second portion edge of a second portion of the first connection wiring overlapping the third pixel electrode is at a second edge of the third pixel electrode, a third portion edge of a third portion of the second connection wiring overlapping the fourth pixel electrode is at a third edge of the fourth pixel electrode, and a fourth portion edge of a fourth portion of the third connection wiring overlapping the second pixel electrode is at the first edge of the second pixel electrode.

7. The display apparatus of claim 4, wherein the first connection wiring comprises a first connection portion extending in the first direction and connected to the first pixel electrode, a second connection portion extending from the first connection portion in the second direction, a third connection portion extending in the first direction and connected to the fourth pixel electrode, and a fourth connection portion extending from the third connection portion in the second direction, and the third connection wiring comprises a fifth connection portion extending in the second direction, connected to the third pixel electrode, and located between the second connection portion and the fourth connection portion of the first connection wiring.

8. The display apparatus of claim 7, wherein the second connection wiring comprises a sixth connection portion extending in the first direction, connected to the second pixel electrode, and adjacent to the third connection wiring.

9. The display apparatus of claim 4, further comprising:

a first contact portion configured to connect the first connection wiring to the fourth pixel electrode;

a second contact portion configured to connect the second connection wiring to the second pixel electrode; and a third contact portion configured to connect the third connection wiring to the third pixel electrode, wherein the first connection wiring surrounds at least a part of the third contact portion, the second connection wiring surrounds at least a part of the first contact portion, and the third connection wiring surrounds at least a part of the second contact portion.

10. The display apparatus of claim 1, wherein the first connection wiring comprises a first portion overlapping the first pixel electrode, a second portion overlapping a part of the second pixel electrode, a third portion overlapping the third pixel electrode, a fourth portion overlapping another part of the second pixel electrode, and a fifth portion overlapping the fourth pixel electrode, wherein the first to fifth portions of the first connection wiring are sequentially arranged in the first connection wiring.

11. The display apparatus of claim 1, further comprising a first insulating layer under the first to fourth display elements and comprising a plurality of trenches surrounding at least parts of the first to fourth pixel electrodes in a plan view.

12. The display apparatus of claim 11, wherein a planar shape of each of the plurality of trenches is a cross shape.

13. The display apparatus of claim 11, further comprising a second insulating layer between the first to fourth display elements and the first insulating layer, at least partially located in the plurality of trenches of the first insulating layer, and comprising a material different from a material of the first insulating layer.

14. The display apparatus of claim 13, wherein the first insulating layer comprises an inorganic material and the second insulating layer comprises an organic material.

15. The display apparatus of claim 1, further comprising:

a substrate comprising a first area and a second area that are adjacent to each other;

a pixel circuit in the second area and configured to drive the first display element and the fourth display element; and a circuit connection wiring configured to connect the pixel circuit to at least one of the first display element or the fourth display element, wherein the first to fourth display elements are in the first area.

16. The display apparatus of claim 15, wherein the pixel circuit comprises a semiconductor layer and a gate electrode on the semiconductor layer, wherein the first connection wiring and the semiconductor layer are on a same layer.

17. The display apparatus of claim 15, wherein the circuit connection wiring comprises a transparent conductive material.

18. The display apparatus of claim 1, wherein the first connection wiring comprises a metal material.

19. The display apparatus of claim 1, wherein the first color is blue.

20. A display apparatus comprising:

a substrate comprising a first area and a second area, wherein the first area comprises a transmissive area and the second area surrounds at least a part of the first area;

a first display element in the first area, configured to emit light of a first color, and comprising a first pixel electrode;

a second display element in the first area, configured to emit light of a second color that is different from the first color, and comprising a second pixel electrode;

a third display element in the first area, configured to emit light of a third color that is different from the first color and the second color, and comprising a third pixel electrode;

a fourth display element in the first area, configured to emit light of the first color, and comprising a fourth pixel electrode;

a connection wiring between the substrate and the first to fourth pixel electrodes and continuously extending beneath and overlapping each of the first pixel electrode, the second pixel electrode, the third pixel electrode, and the fourth pixel electrode in a thickness direction of the display apparatus, configured to connect the first pixel electrode to the fourth pixel electrode, and at least partially overlapping the first to fourth pixel electrodes, and comprising an oxide semiconductor material;

a pixel circuit in the second area; and a fifth display element in the second area, electrically connected to the pixel circuit, and at least partially overlapping the pixel circuit.

* * * * *